US012791942B2

(12) United States Patent
Noh et al.

(10) Patent No.: US 12,791,942 B2
(45) Date of Patent: Nov. 10, 2026

(54) APPARATUS FOR TREATING SUBSTRATE AND METHOD FOR TREATING A SUBSTRATE

(71) Applicant: SEMES CO., LTD., Cheonan-si (KR)

(72) Inventors: Sang Eun Noh, Pohang-si (KR); Eun Woo Park, Gyeongsan-si (KR)

(73) Assignee: Semes Co., Ltd., Chungcheongnam-do (KR)

(*) Notice: Subject to any disclaimer, the term of this patent is extended or adjusted under 35 U.S.C. 154(b) by 834 days.

(21) Appl. No.: 17/860,198

(22) Filed: Jul. 8, 2022

(65) Prior Publication Data

US 2023/0007843 A1 Jan. 12, 2023

(30) Foreign Application Priority Data

Jul. 8, 2021 (KR) ........................ 10-2021-0089960

(51) Int. Cl.
*G03F 7/16* (2006.01)
*B08B 9/093* (2006.01)
(Continued)

(52) U.S. Cl.
CPC .............. *G03F 7/162* (2013.01); *B08B 9/093* (2013.01); *B08B 13/00* (2013.01);
(Continued)

(58) Field of Classification Search
CPC ....... H01L 21/67155-67178; H01L 21/67288; G03F 7/162
See application file for complete search history.

(56) References Cited

U.S. PATENT DOCUMENTS 5,234,499 A 8/1993 Sasaki et al.
2020/0026205 A1 1/2020 Park et al.
(Continued)

FOREIGN PATENT DOCUMENTS

CN 109494174 A 3/2019
CN 112309894 A 2/2021
(Continued)

OTHER PUBLICATIONS

Uchida (KR 20190029439) translation (Year: 2019).*
(Continued)

*Primary Examiner* — Dah-Wei D. Yuan
*Assistant Examiner* — Stephen A Kitt
(74) *Attorney, Agent, or Firm* — Harness, Dickey & Pierce, P.L.C.

(57) ABSTRACT

Provided is an apparatus for treating a substrate. The apparatus for treating a substrate may include: a liquid treating chamber configured to liquid-treat a substrate; and a controller configured to control the liquid treating chamber, and the liquid treating chamber may include a treating container having a treating space therein; a support unit configured to support and rotate the substrate in the treating space; a liquid supply unit configured to supply a liquid onto the substrate; and an elevation unit configured to adjust a relative height between the treating container and the support unit, and the controller may control the elevation unit so as to adjust the relative height between the treating container and the support unit according to a warpage state of the substrate supported on the support unit when conducting substrate treating by supplying the liquid onto the substrate while rotating the substrate.

18 Claims, 15 Drawing Sheets

(51) Int. Cl.
*B08B 13/00* (2006.01)
*H10P 72/00* (2026.01)

(52) U.S. Cl.
CPC ...... *H10P 72/0456* (2026.01); *H10P 72/0474* (2026.01); *B08B 2209/08* (2013.01)

(56) References Cited

U.S. PATENT DOCUMENTS

| | | | | |
|---|---|---|---|---|
| 2020/0027761 | A1 | 1/2020 | Park et al. | |
| 2020/0144054 | A1 | 5/2020 | Oa et al. | |
| 2021/0028034 | A1 * | 1/2021 | Hwang | H01L 21/6875 |

FOREIGN PATENT DOCUMENTS

| | | | | | |
|---|---|---|---|---|---|
| CN | 113035741 | A | | 6/2021 | |
| JP | 2002119904 | A | | 4/2002 | |
| JP | 2004241433 | A | | 8/2004 | |
| JP | 20199416 | A | | 1/2019 | |
| JP | 2019-050287 | A | | 3/2019 | |
| JP | 202194511 | A | | 6/2021 | |
| KR | 10-2003-0059046 | A | | 7/2003 | |
| KR | 10-2007-0113143 | A | | 11/2007 | |
| KR | 10-2018-0078743 | A | | 7/2018 | |
| KR | 10-2019-0029439 | A | | 3/2019 | |
| KR | 20190029439 | A | * | 3/2019 | G03F 7/30 |
| KR | 10-2019-0054370 | A | | 5/2019 | |

OTHER PUBLICATIONS

Office Action, dated May 16, 2023, issued in corresponding Japanese Patent Application No. 2022-108763.

Office Action for Korean Application No. 10-2021-0089960 dated Jan. 30, 2023.

Office Action issued Jul. 11, 2025 in Chinese Application No. 202210806372.8.

* cited by examiner

APPARATUS FOR TREATING SUBSTRATE AND METHOD FOR TREATING A SUBSTRATE

CROSS-REFERENCE TO RELATED APPLICATIONS

This application claims priority to and the benefit of the Korean Patent Application No. 10-2021-0089960 filed in the Korean Intellectual Property Office on Jul. 8, 2021, the entire contents of which are incorporated herein by reference.

TECHNICAL FIELD

The present invention relates to an apparatus for treating a substrate, and more particularly, an apparatus and a method for treating a substrate by liquid-treating a rotating substrate.

BACKGROUND ART

In order to manufacture a semiconductor device, various processes such as cleaning, deposition, photolithography, etching, and ion implantation are performed. Among the processes, the lithography process includes a coating process of forming a film by coating a photosensitive liquid such as a photoresist onto a surface of a substrate, an exposure process of transferring a circuit pattern onto a film formed on the substrate, and a developing process of selectively removing the film formed on the substrate in an exposure-treated region or an opposite region thereto.

In recent years, in a semiconductor substrate, multilayering in which circuit layers are laminated has been achieved, fine patterning in which a circuit pattern is refined has been achieved, and the substrate has become larger. In a recent trend of the multilayering, the fine patterning, and enlargement of the substrate, a warpage phenomenon is caused on the substrate. As an example, in the etching process, due to mutual attractions of impurities caused while etching pattern target films having different etching rates or laminated materials, a difference of a line width (critical dimension (CD)) of the pattern is caused and patterns are inclined to each other, which causes the warpage phenomenon on the substrate. As another example, the semiconductor substrate is multilayered, and as a result, a pressure difference occurs between respective layers, which causes a phenomenon in which any one side of the substrate is warped. Besides, warpage occurs on the substrate by an influence of various pretreating processes such as film forming on the substrate. The warpage phenomenon of the substrate increases a process defective rate when performing a subsequent unit process.

FIG. 1 is a cross-sectional view illustrating a general substrate treating apparatus. Referring to FIG. 1, a substrate treating apparatus 8000 includes a treating container 8200 having a treating space, a support unit 8300 supporting and rotating a substrate W, and a liquid supply unit 8400 supplying a liquid to the substrate W. When a liquid treating process is performed while the substrate W is warped, if a liquid is discharged to the rotating substrate W, the liquid may be scattered to an inclined portion P of the treating container 8200. The liquid may be deposited on the inclined portion P of the treating container 8200 which is a space formed by the treating container 8200 recovering a treating medium and the support unit 8300.

After the liquid treating on the substrate is performed, cleaning treating of the treating container 8200 may be performed. In this case, the liquid is deposited on the inclined portion P which is an unintentional region of the treating container 8200, and as a result there is a problem in that cleaning efficiency for the treating container 8200 is lowered.

Since the liquid at the inclined portion P of the treating container 8200 is not removed, an air flow speed may increase in the space formed between the treating container 8200 and the support unit 8300. Various liquids including a coating liquid supplied to the support unit 8300 may be lost due to the increased air flow speed. Further, the liquid supplied from the liquid supply unit 8400 is scattered in a treating space to contaminate a subsequent substrate W subjected to a subsequent liquid treating process.

SUMMARY OF THE INVENTION

The present invention has been made in an effort to provide an apparatus for treating a substrate and a method for treating a substrate which may increase efficiency of a liquid treating process.

The present invention has also been made in an effort to provide an apparatus for treating a substrate and a method for treating a substrate which may prevent a liquid from being deposited on an unintentional region of a treating container when performing the liquid treating process while rotating a substrate.

The present invention has also been made in an effort to provide an apparatus for treating a substrate and a method for treating a substrate which may effectively perform cleaning of the treating container after conducting the liquid treating process.

The present invention has also been made in an effort to provide an apparatus for treating a substrate and a method for treating a substrate which may prevent reverse contamination for a trailing substrate after conducting the liquid treating process for the a preceding substrate.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for treating a substrate. The apparatus for treating a substrate may include: a liquid treating chamber configured to liquid-treat a substrate; and a controller configured to control the liquid treating chamber, and the liquid treating chamber may include a treating container having a treating space therein; a support unit configured to support and rotate the substrate in the treating space; a liquid supply unit configured to supply a liquid onto the substrate; and an elevation unit configured to adjust a relative height between the treating container and the support unit, and the controller may control the elevation unit so as to adjust the relative height between the treating container and the support unit according to a warpage state of the substrate supported on the support unit when conducting substrate treating by supplying the liquid onto the substrate while rotating the substrate.

According to an exemplary embodiment, the controller may control the elevation unit so that a top surface of the support unit is arranged below an upper end of the treating container by a reference height when the substrate is in a flat state for a ground surface and the top surface of the support unit is arranged below the reference height at the upper end of the treating container when the substrate is in a convex state in a lower direction for the ground surface.

According to an exemplary embodiment, the apparatus may further include a heat treating chamber configured to heat-treat the substrate, and the warpage state of the substrate may be measured in the heat treating chamber.

According to an exemplary embodiment, the heat treating chamber may include a heating plate on which the substrate is placed; a sensor configured to measure each region-specific temperature parameter of the substrate placed on the heating plate; and a detector configured to determine the warpage state of the substrate based on the temperature parameter value measured by the sensor.

According to an exemplary embodiment, the heat treating chamber may include a first heater configured to heat a central region of the heating plate; a second heater configured to heat an edge region of the heating plate; a first power supply line configured to apply power to the first heater; and a second power supply line configured to apply the power to the second heater, and the sensor may include a first sensor configured to measure the power supplied to the first power supply line; and a second sensor configured to measure the power supplied to the second power supply line.

According to an exemplary embodiment, the detector may determine that the substrate is in the warpage state when the power value of the first power supply line measured by the first sensor is measured to be higher than the power value of the second power supply line measured by the second sensor.

According to an exemplary embodiment, the sensor may measure the power immediately after the substrate is seated on the heating plate.

According to an exemplary embodiment, the liquid may be a photoresist.

According to an exemplary embodiment, the liquid treating chamber may further include a cleaning nozzle configured to discharge a cleaning solution for cleaning the treating container, and the controller may control the elevation unit so that a location where the cleaning solution supplied to the substrate reaches the treating container by a centrifugal force when the substrate is in a flat state and a location where the cleaning solution supplied to the substrate reaches the treating container by the centrifugal force when the substrate is in a convex state in the lower direction for the ground surface are the same as each other.

Further, another exemplary embodiment of the present invention provides an apparatus for treating a substrate. The apparatus for treating a substrate may include: an index module having a load port in which a container storing a substrate is placed; and a treating module to perform a process of treating the substrate, and the treating module may include a buffer chamber configured to temporarily keep the substrate; a transfer chamber configured to transfer the substrate between the buffer chamber and the treating module; a heat treating chamber configured to heat or cool the substrate; a liquid treating chamber configured to supply a coating liquid or a developing liquid to the substrate; and a controller configured to control the liquid treating chamber, the liquid treating chamber may include a treating container having a treating space therein; a support unit configured to support and rotate the substrate in the treating space; a liquid supply unit configured to supply a liquid onto the substrate; and an elevation unit configured to adjust a relative height between the treating container and the support unit, and the controller may control the elevation unit so as to adjust the relative height between the treating container and the support unit according to a warpage state of the substrate supported on the support unit when conducting substrate treating by supplying the liquid onto the substrate while rotating the substrate.

According to an exemplary embodiment, the controller may control the elevation unit so that a top surface of the support unit is arranged below an upper end of the treating container by a reference height when the substrate is in a flat state for a ground surface and the top surface of the support unit is arranged below the reference height at the upper end of the treating container when the substrate is in a convex state in a lower direction for the ground surface.

According to an exemplary embodiment, the heat treating chamber may include a heating plate on which the substrate is placed; a first heater configured to heat a central region of the heating plate; a second heater configured to heat an edge region of the heating plate; a first power supply line configured to apply power to the first heater; and a second power supply line configured to apply the power to the second heater; a sensor configured to measure each region-specific temperature parameter of the substrate placed on the heating plate; and a detector configured to determine the warpage state of the substrate based on the temperature parameter value measured by the sensor, the sensor may include a first sensor configured to measure the power supplied to the first power supply line; and a second sensor configured to measure the power supplied to the second power supply line, and the detector may determine that the substrate is in the warpage state when the power value of the first power supply line measured by the first sensor is measured to be higher than the power value of the second power supply line measured by the second sensor.

According to an exemplary embodiment, the liquid treating chamber may further include a cleaning nozzle configured to discharge a cleaning solution for cleaning the treating container, and the controller may control the elevation unit so that a location where the cleaning solution supplied to the substrate reaches the treating container by a centrifugal force when the substrate is in a flat state and a location where the cleaning solution supplied to the substrate reaches the treating container by the centrifugal force when the substrate is in a convex state in the lower direction for the ground surface are the same as each other.

Further, yet another exemplary embodiment of the present invention provides a method for treating a substrate. The method for treating a substrate may include: arranging, by a liquid treating chamber, a substrate in a support unit positioned in a treating container and liquid-treating the substrate by supplying a liquid to a rotating substrate; and adjusting a relative height between the treating container and the support unit according to a warpage state of the substrate.

According to an exemplary embodiment, when a distance between an upper end of the treating container and a top surface of the support unit while the substrate is in a flat state for a ground surface is set to a reference distance, a relative height between the upper end of the treating container and the top surface of the support unit may be adjusted as a distance larger than the reference distance when the substrate is in a curved state in a lower direction for the ground surface.

According to an exemplary embodiment, the heat treating chamber may heat the substrate before liquid-treating the substrate, and the warpage state of the substrate may be determined when heating the substrate.

According to an exemplary embodiment, each of first power supplied to a first heater heating a central region of the substrate and second power supplied to a second heater heating n edge region of the substrate in a heating plate of the heat treating chamber may be measured by a sensor, and when the first power value is measured to be higher than the second power value, it may be determined that the substrate is in the warpage state.

According to an exemplary embodiment, the warpage state of the substrate may be measured immediately after the substrate is placed on the heating plate.

According to an exemplary embodiment, the liquid treating chamber may clean the treating container, and a cleaning solution may be supplied to the same point of the treating container regardless of the warpage state of the substrate.

According to an exemplary embodiment, the liquid may be a photoresist.

According to the exemplary embodiment, efficiency of a liquid treating process can be enhanced.

Further, according to the exemplary embodiment of the present invention, when the liquid treating process is performed while rotating a substrate, a liquid can be prevented from being deposited on an unintentional region of a treating container according to a warpage state of the substrate.

Further, according to the exemplary embodiment of the present invention, cleaning the treating container can be effectively performed after conducting the liquid treating process.

Further, according to the exemplary embodiment of the present invention, reverse contamination for a trailing substrate can be prevented after conducting the liquid treating process for a preceding substrate.

The effect of the present invention is not limited to the foregoing effects, and non-mentioned effects will be clearly understood by those skilled in the art from the present specification and the accompanying drawings.

DETAILED DESCRIPTION

Figure 1:
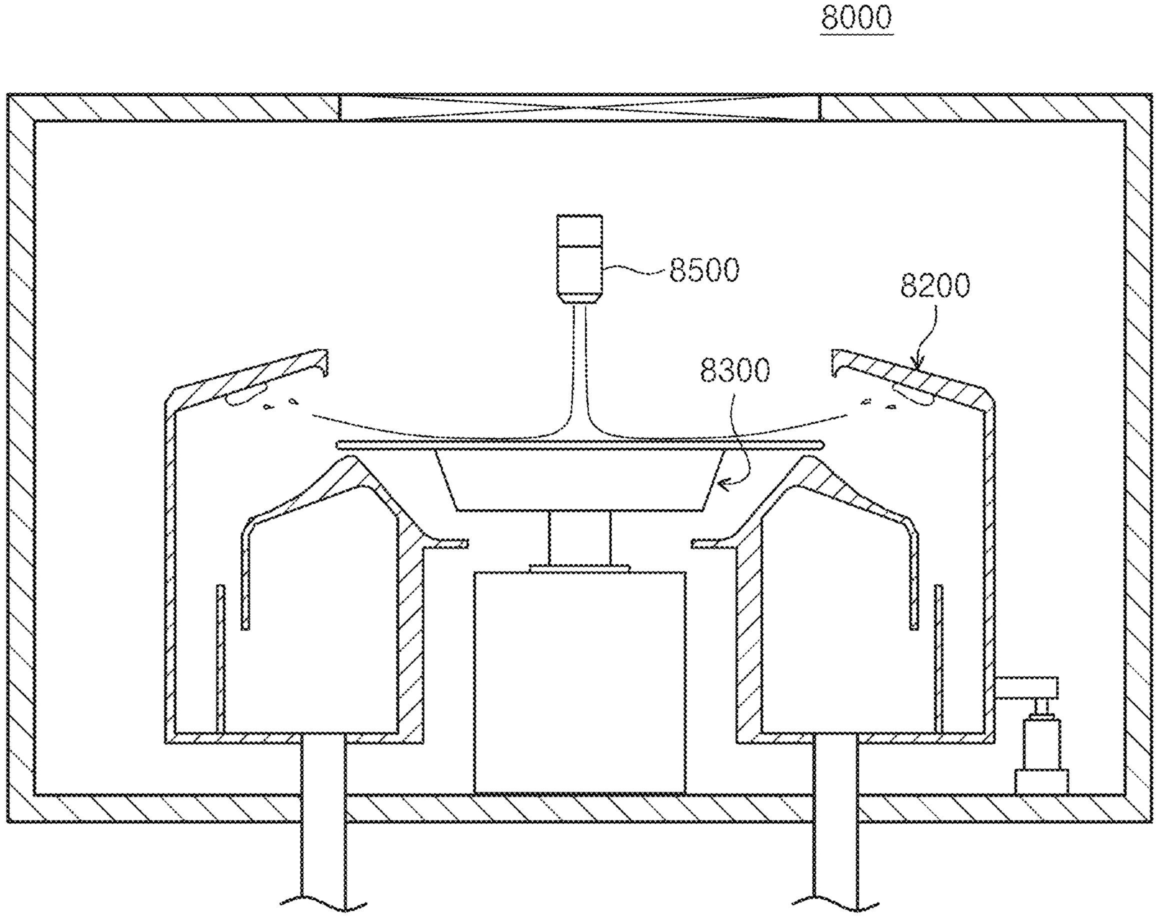
FIG. 1 is a cross-sectional view schematically illustrating a process chamber of a general substrate treating apparatus.

Hereinafter, an exemplary embodiment of the present invention will be described in more detail with reference to the accompanying drawings. The exemplary embodiment of the present invention can be modified in various forms, and it should not be construed that the scope of the present invention is limited to exemplary embodiments described below. The exemplary embodiment will be provided for more completely describing the present invention to those skilled in the art. Accordingly, a shape of a component in the drawing is exaggerated in order to emphasizing more clear description.

Hereinafter, an example of the present invention will be described in detail with reference to FIGS. 2 to 16. In the following exemplary embodiment, an apparatus for coating a photoresist onto a substrate and performing a process of developing the substrate after exposure will be described as an example as an apparatus for treating a substrate. However, the present invention is not limited thereto, and is applicable to various types of apparatuses which supply a liquid to a rotating substrate and treat the substrate. For example, the substrate treating apparatus may be an apparatus which performs a process of removing foreign substances on the substrate by supplying a cleaning solution to the substrate or removing a thin film from the substrate by supplying a chemical solution to the substrate.

Figure 2:
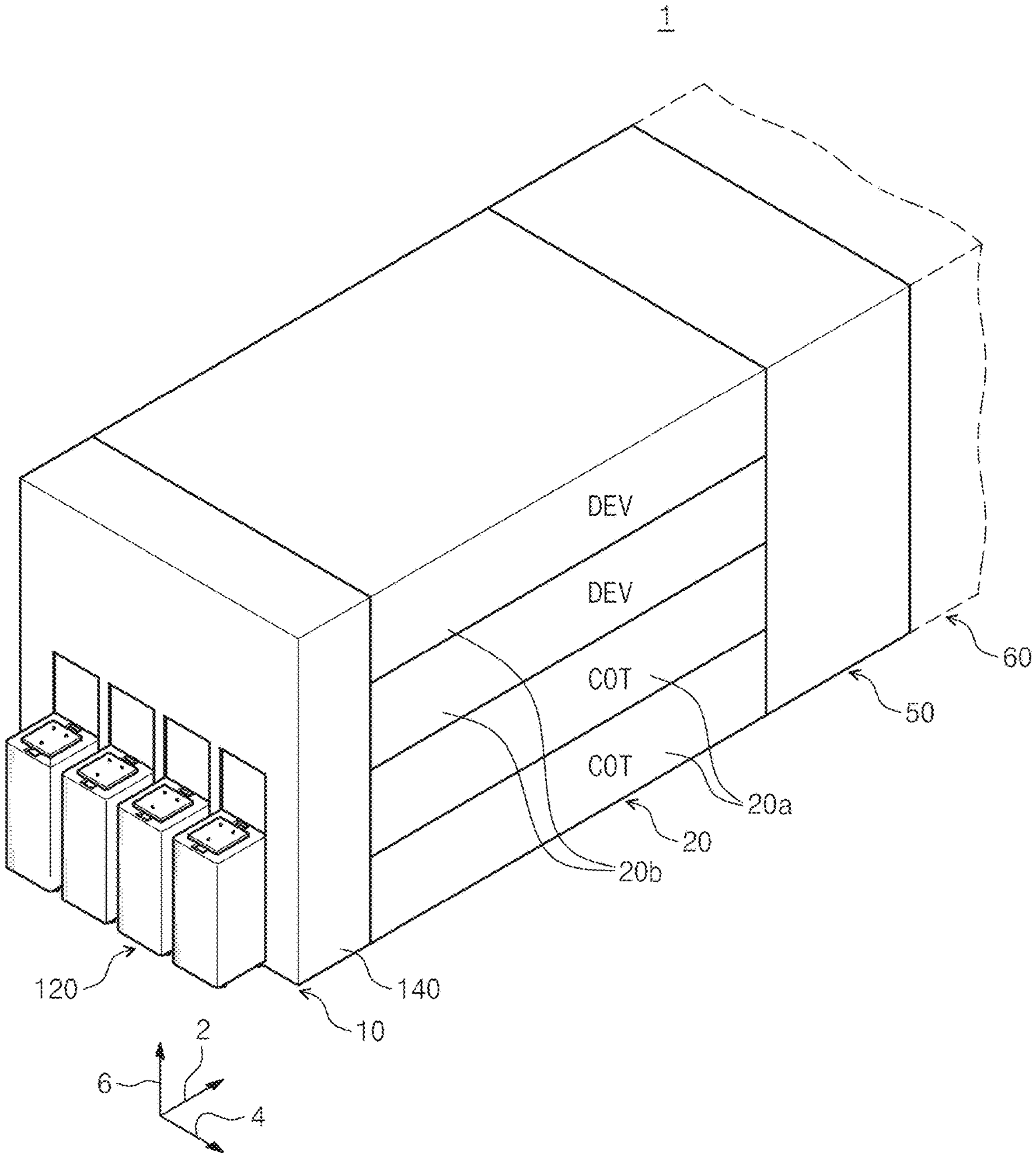
FIG. 2 is a perspective view schematically illustrating an apparatus for treating a substrate according to an exemplary embodiment of the present invention.
Figure 3:
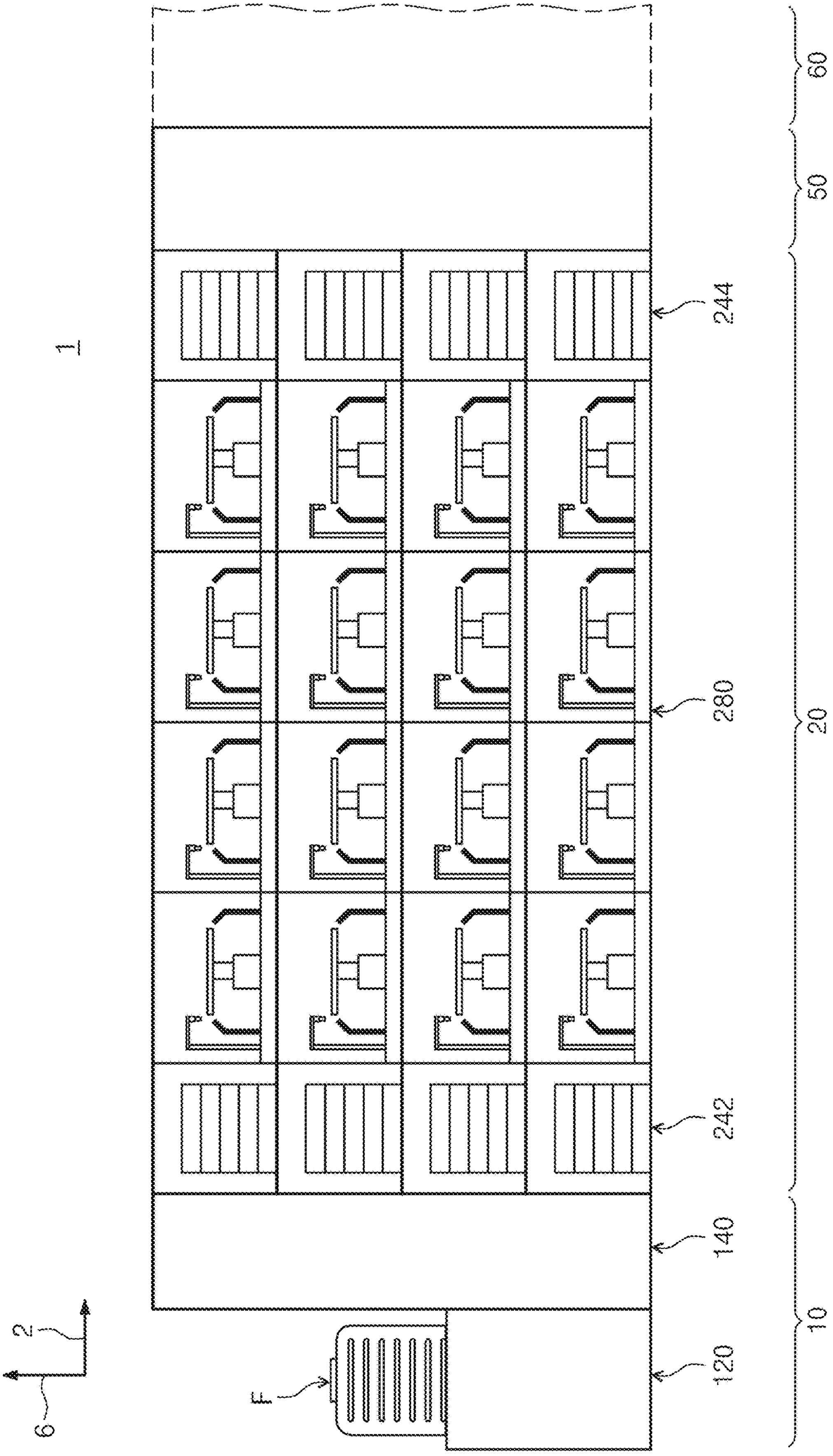
FIG. 3 is a front view of the apparatus for treating a substrate showing a coating block or a developing block in FIG. 2.
Figure 4:
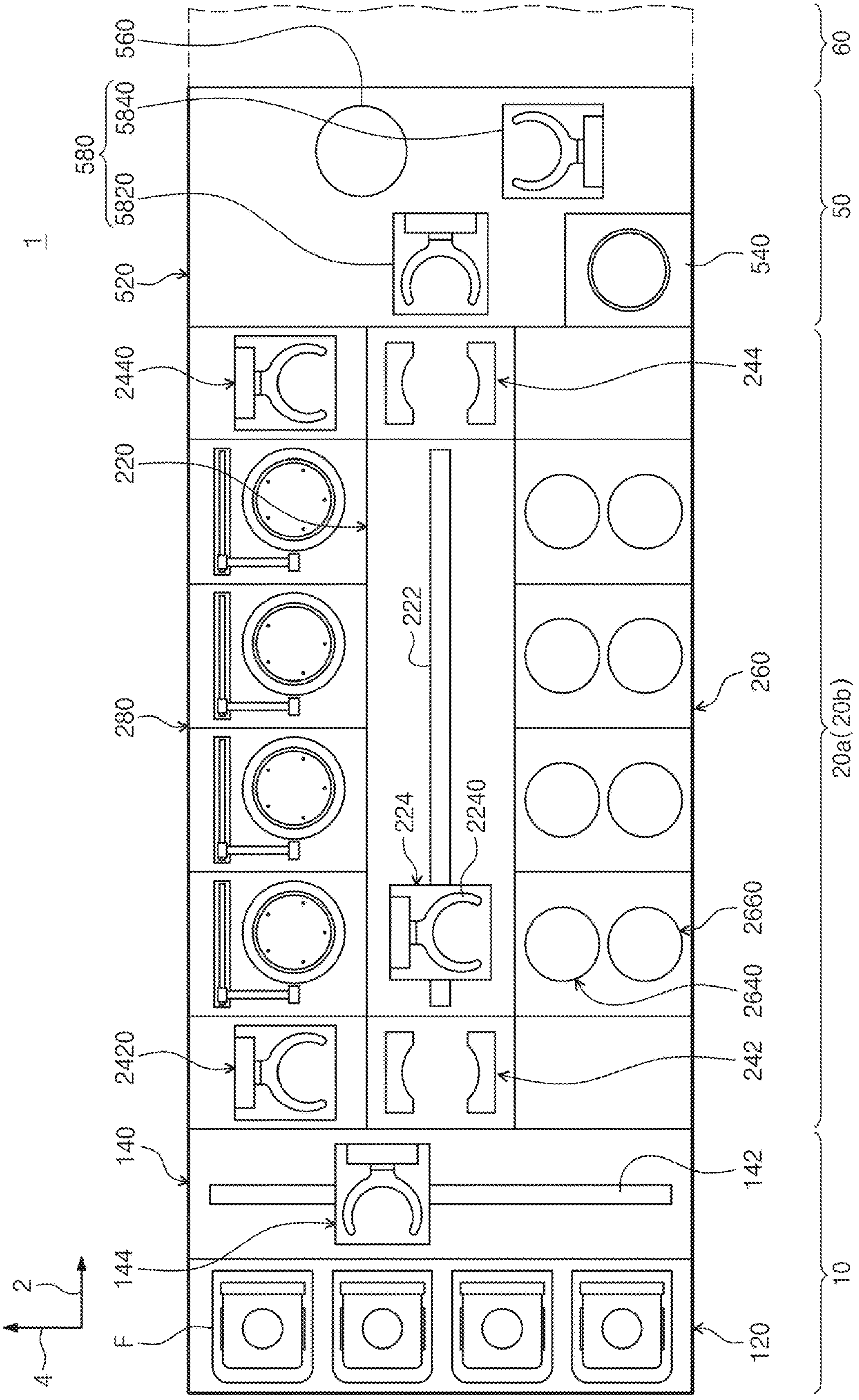
FIG. 4 is a plan view of the apparatus for treating a substrate in FIG. 2.

FIG. 2 is a perspective view schematically illustrating an apparatus for treating a substrate according to an exemplary embodiment of the present invention and FIG. 3 is a front view of the apparatus for treating a substrate in FIG. 2. FIG. 4 is a plan view of the apparatus for treating a substrate in FIG. 2.

Referring to FIGS. 2 to 4, the substrate treating apparatus 1 includes an index module 10, a treating module 20, and an interface module 30. According to an exemplary embodiment, the index module 10, the treating module 20, and the interface module 30 are sequentially arranged in line. Hereinafter, a direction in which the index module 10, the treating module 20, and the interface module 30 are arranged will be defined as a first direction 2, a direction vertical to the first direction when viewed from the top will be defined as a second direction 4, and a direction vertical to a plane, which includes both the first direction 2 and the second direction 4 will be defined as a third direction 6.

The index module 10 transfers the substrate W to the treating module 20 treating the substrate W from a container F storing the substrate W. The index module 10 stores the substrate W of which treating is completed in the treating module 20 in the container F. A longitudinal direction of the index module 10 is provided as the second direction 4. The index module 10 has a load port 120 and an index frame 140.

The container F storing the substrate W is seated on the load port 120. The load port 120 is positioned at an opposite side to the treating module 20 based on the index frame 140. A plurality of load ports 120 may be provided, and the plurality of load ports 120 may be arranged in line in the second direction 4. The number of load ports 120 may increase or decrease according to process efficiency and a footprint condition of the treating module 20.

Multiple slots (not illustrated) for storing the substrates W which are horizontally arranged to a ground surface are formed in the container F. A sealing container such as a front opening unified pod (FOUP) may be used as the container F. The container F may be placed on the load port 120 by a transportation means (not illustrated) or a worker such as overhead transfer, overhead conveyor, or an automatic guided vehicle.

An index rail 142 and an index robot 144 are provided inside the index frame 140. The index rail 142 is provided in the second direction 4 which is the longitudinal direction in the index frame 140. The index robot 144 may transfer the substrate W. The index robot 144 may transfer the substrate W between the index module 10 and a buffer chamber 240 to be described below. The index robot 144 may include an index hand 1440. The substrate W may be placed on the index hand 1440. The index hand 1440 may include an index base 1442 having an annular ring shape in which a part of a circumference is bent to be symmetric and an index support unit 1444 moving the index base 1442. A configuration of the index hand 1440 is the same as to similar to the configuration of a transfer hand 2240 to be described below. The index hand 1440 may be provided to be movable in the second direction 4 on the index rail 142. Therefore, the index hand 1440 is movable forward and backward along the index rail 142. Further, the index hand 1440 may be provided to be rotatable with the third direction 6 as an axis and movable in the third direction 6.

The treating module 20 performs the coating process and the developing process for the substrate W by receiving the substrate W stored in the container F. The treating module 20 has a coating block 20*a* and a developing block 20*b*. The coating block 20*a* performs a coating process for the substrate W. The developing block 20*b* performs a developing process for the substrate W. A plurality of coating blocks 20*a* is provided and the coating blocks 20*a* are provided to be laminated on each other. A plurality of developing blocks 20*b* is provided and the developing blocks 20*b* are provided to be laminated on each other. According to the exemplary embodiment of FIG. 1, two coating blocks 20*a* are provided and the developing blocks 20*b* are provided. The coating blocks 20*a* may be arranged below the developing blocks 20*b*. According to an example, two coating blocks 20*a* may perform the same process and may be provided in the same structure. Further, two coating blocks 20*b* may perform the same process and may be provided in the same structure.

Referring to FIG. 4, the coating block 20*a* includes a transfer chamber 220, a buffer chamber 230, a heat treating chamber 260, and a liquid treating chamber 280. The transfer chamber 220 provides a space for transferring the substrate W between the buffer chamber 240 and the heat treating chamber 260, between the buffer chamber 240 and the liquid treating chamber 280, and between the heat treating chamber 260 and the liquid treating chamber 280. The buffer chamber 240 provides a space in which the substrate W loaded into the coating block 20*a* and the substrate W unloaded from the coating block 20*a* temporarily stay. The heat treating chamber 260 performs the heat treating process for the substrate W. The heat treating process may include a cooling process and a heating process. The heat treating chamber 260 forms a liquid film by supplying the liquid onto the substrate W. The liquid film may be a photoresist film or an anti-reflective film.

The longitudinal direction of the transfer chamber 220 may be provided as the first direction 2. A guide rail 222 and a transfer robot 224 are provided to the transfer chamber 220. The longitudinal direction of the guide rail 222 may be provided in the transfer chamber 220 in the first direction 2 as the longitudinal direction. The transfer robot 224 may be provided to be movable linearly in the first direction 2 on the guide rail 222. The transfer robot 224 transfers the substrate W between the buffer chamber 240 and the heat treating chamber 260, between the buffer chamber 240 and the liquid treating chamber 280, and between the heat treating chamber 260 and the liquid treating chamber 280.

According to an example, the transfer robot 224 has the transfer hand 2240 on which the substrate W is placed. The transfer hand 2240 may be provided to be movable forward and backward, rotatable with the third direction 6 as the axis and movable in the third direction 6.

Figure 5:
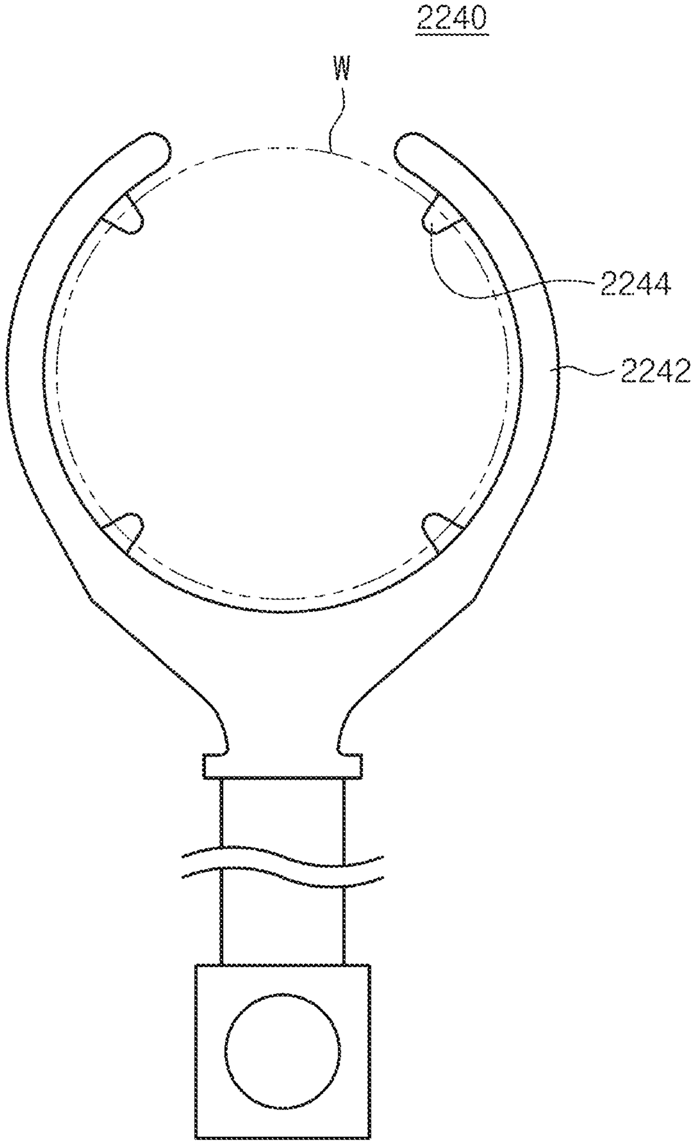
FIG. 5 is a diagram illustrating an example of a hand provided to a transfer chamber in FIG. 4.

FIG. 5 is a diagram illustrating an example of a transfer hand provided to a transfer chamber in FIG. 4. Referring to FIG. 5, the transfer hand 2240 includes a base 2242 and a support protrusion 2244. The base 2242 may have the annular ring shape in which a part of the circumference is bent. The base 2242 may have a ring shape in which a part of the circumference is bent to be symmetric. The base 2242 has an inner diameter larger than a diameter of the substrate W. The support protrusion 2244 extends inward from the base 2242. A plurality of support protrusion 2244 is provided, and supports an edge region of the substrate W. According to an example, four support protrusion 2244 may be provided at an equal interval.

Referring back to FIGS. 3 and 4, a plurality of buffer chambers 240 is provided. Some of the buffer chambers 240 are arranged between the index module 10 and the transfer chamber 220. Hereinafter, the buffer chamber will be defined as a front buffer 242. A plurality of front buffers 242 is provided and arranged to be laminated on each other in an up and down direction. Other some of the buffer chambers 240 are arranged between the transfer chamber 220 and the interface module 30. Hereinafter, the buffer chamber will be defined as a rear buffer 244. A plurality of rear buffers 244 is provided and arranged to be laminated on each other in the up and down direction. Each of the front buffers 242 and the rear buffers 244 temporarily keeps a plurality of substrates W. The substrate W stored in the front buffer 242 is loaded or unloaded by the index robot 144 and the transfer robot 224. The substrate W stored in the rear buffer 244 is loaded or unloaded by the transfer robot 224 and a first robot 3820 to be described below.

The buffer robots 2420 and 2440 may be provided at one side of the buffer chamber 240. The buffer robots 2420 and 2440 may include a front buffer robot 2420 and a rear buffer robot 2440. The front buffer robot 2420 may be provided at one side of the front buffer 242. The rear buffer robot 2440 may be provided at one side of the rear buffer 244. The buffer robots 2420 and 2440 are not limited thereto, and may be provided at both sides of the buffer chamber 240.

The front buffer robot 2420 may transfer the substrate W between the front buffers 242. The front buffer robot 2420 may include a front buffer hand 2422. The front buffer hand 2422 may move in the up and down direction in the third direction 6. The front buffer hand 2422 may be rotated. The front buffer hand 2422 may transfer the substrate W. The front buffer hand 2422 may load or unload the substrate W on or from pins 2486 provided on a support plate 2482 to be described below. The rear buffer robot 2440 may transfer the substrate W between the rear buffers 244. The rear buffer robot 2440 may include a rear buffer hand 2442. The configuration of the rear buffer hand 2442 is the same as or similar to the configuration of the front buffer hand 2422. Accordingly, a description of the rear buffer hand 2422 is omitted.

Figure 6:
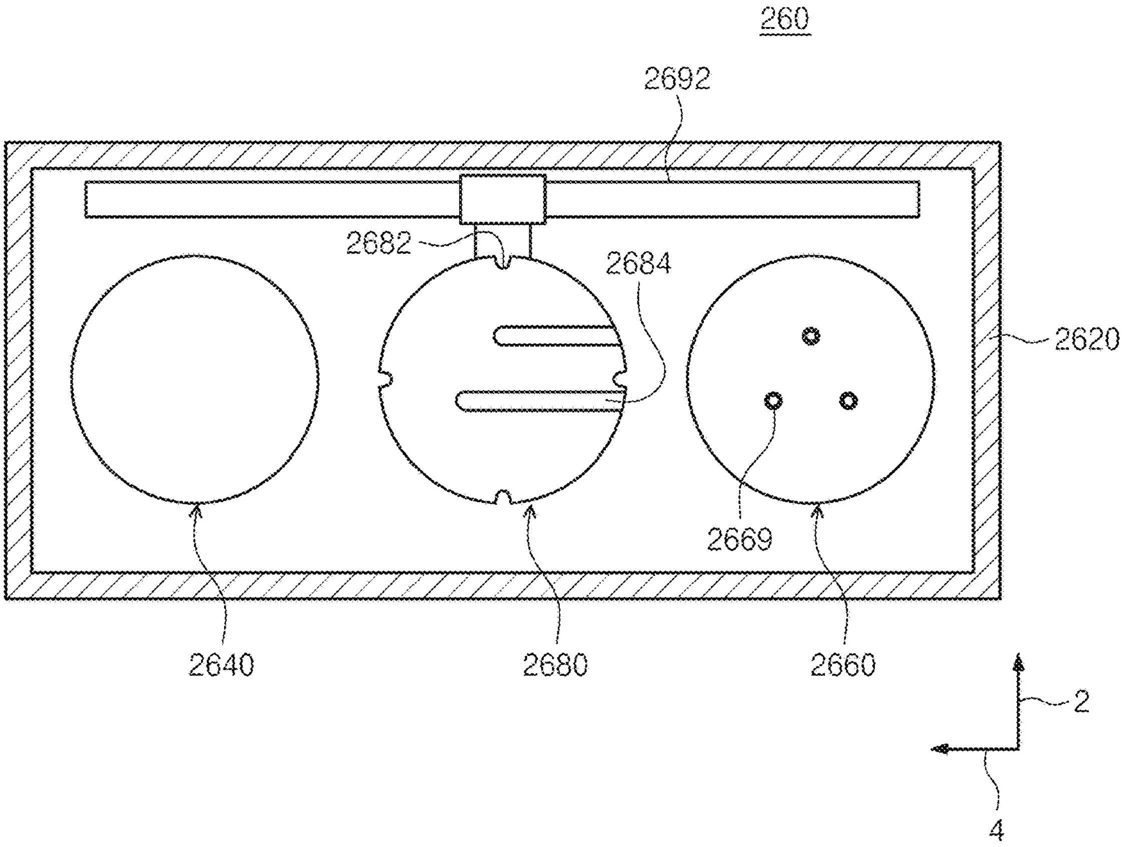
FIG. 6 is a plan view schematically illustrating an example of a heat treating chamber in FIG. 4.
Figure 7:
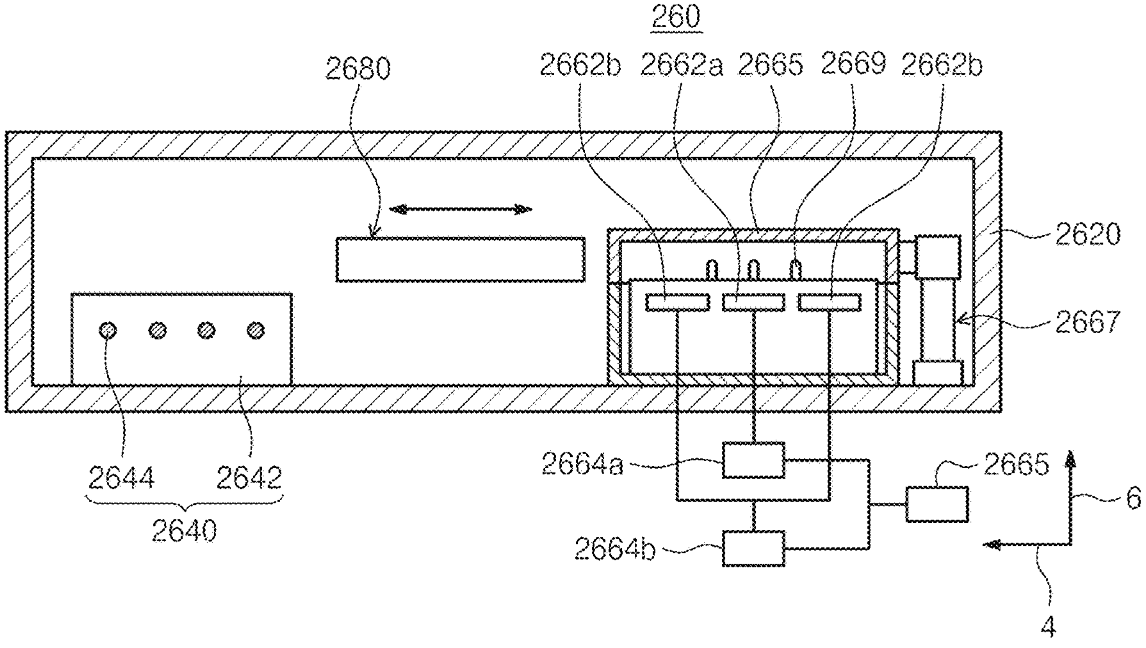
FIG. 7 is a front view of the heat treating chamber in FIG. 6.
Figure 8:
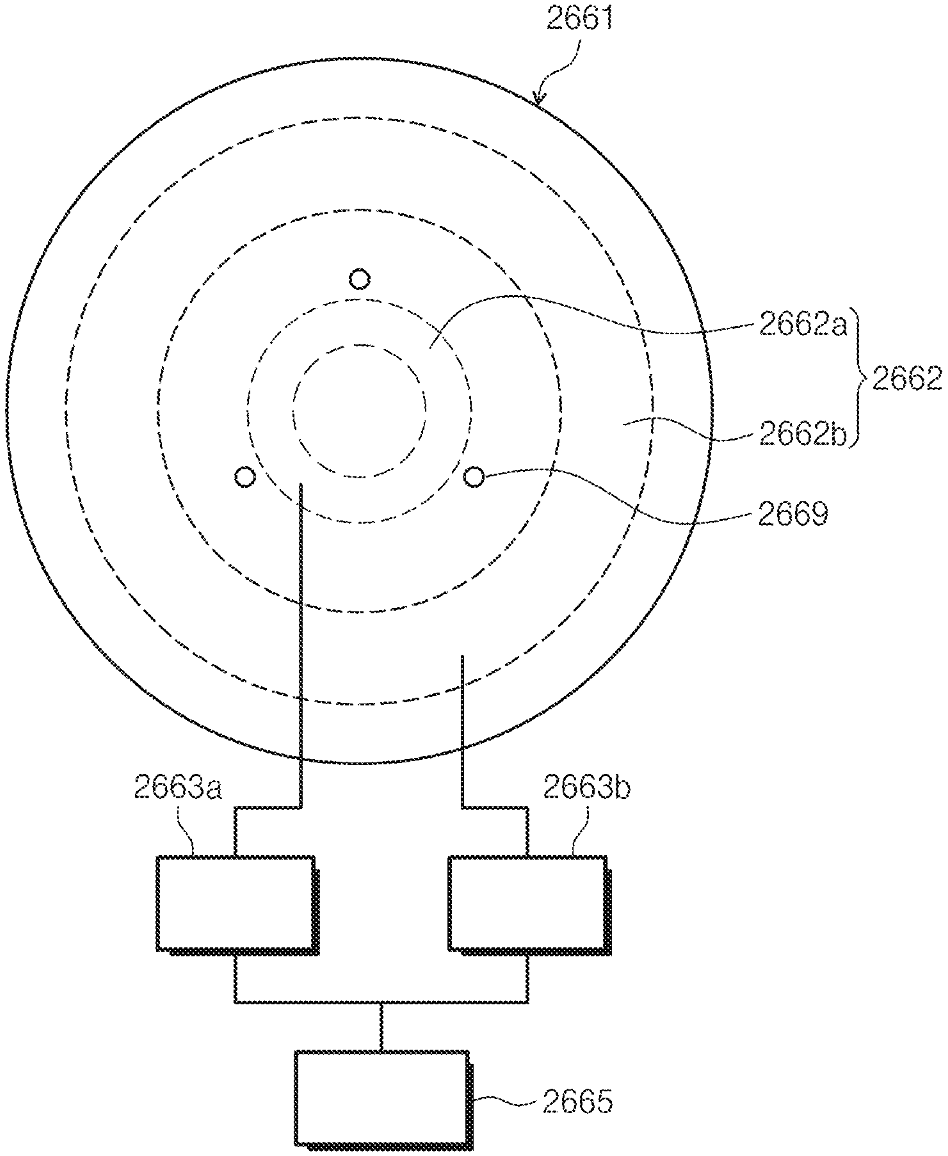
FIG. 8 is a diagram schematically illustrating an example of a heating plate in FIG. 6.

FIG. 6 is a plan view schematically illustrating an example of a heat treating chamber in FIG. 4 and FIG. 7 is a front view of the heat treating chamber in FIG. 6. FIG. 8 is a diagram schematically illustrating an example of a heating plate in FIG. 6. Referring to FIGS. 6 to 8, a plurality of heat treating chambers 260 is provided. The heat treating chambers 260 are arranged in the first direction 2. The heat treating chambers 260 are positioned at one side of the transfer chamber 220. The heat treating chamber 260 includes a housing 2620, a cooling unit 2640, a heating unit 2660, and a transfer plate 2680.

The housing 2620 is provided in a substantially rectangular parallelepiped shape. The housing 2620 provides a space therein. An entrance (not illustrated) through which the substrate W enters and exits is formed on a side wall of the housing 2620. The entrance may be maintained in an opened state. A door (not illustrated) may be provided to selectively open/close the entrance. The cooling unit 2640, the heating unit 2660, and the transfer plate 2680 are provided in the internal space of the housing 2620. The cooling unit 2640 and the heating unit 2660 are provided in line in the second direction 4. According to an example, the cooling unit 2640 may be positioned relatively closer to the transfer chamber 220 than the heating unit 2660. Each unit 2640 includes a cooling plate 2642. The cooling plate 2642 may have a substantially circular shape when viewed from the top. A cooling member 2644 is provided in the cooling plate 2642. According to an example, the cooling member 2644 may be formed inside the cooling plate 2642 and provided as a path in which a cooling fluid flows.

The heating unit 2660 includes a heating plate 2661, a heater 2662, a power supply line 2663, a sensor 2664, a detector 2665, a cover 2666, and a driver 2667.

The heating plate 2661 heats the substrate W. The heating plate 2661 may have the substantially circular shape when viewed from the top. The heating plate 2661 has a larger diameter than the substrate W. The substrate W is seated on heating plate 2661. The heater 2662 is installed in the heating plate 2661. The heater 2662 is connected to the power supply line 2663 to be described below. The heater 2662 may be provided as a heating resistor to which current is applied. The heater 2662 may include a first heater 2662*a* and a second heater 2662*b*. The first heater 2662*a* and the second heater 2662*b* heat different regions of the heating plate 2661. The first heater 2662*a* is positioned at a central region of the heating plate 2662. The first heater 2662*a* may heat the central region of the substrate W. The second heater 2662*b* is positioned at the edge region of the heating plate 2662. The second heater 2662*b* may heat the edge region of the substrate W.

The power supply line 2663 may include a first power supply line 2663*a* and a second power supply line 2663*b*. The first power supply line 2663*a* may apply power to the first heater 2662*a*. The power supplied to the first heater 2662*a* emits heat by a resistor and transmits the heat to the central region of the substrate W. The second power supply line 2663*b* may apply the power to the second heater 2662*b*. The power supplied to the second heater 2662*a* emits the heat by the resistor and transmits the heat to the central region of the substrate W.

The sensor 2664 may measure a region-specific temperature parameter of the substrate W placed on the heating plate 2661. The sensor 2664 may measure the temperature parameter just after the substrate W is seated on the heating plate 2661. As a result, since an accurate temperature parameter may be acquired regardless of an environmental factor inside the heat treating chamber 260, the reliability of the temperature parameter may be secured. The sensor 2664 may include a first sensor 2664*a* and a second sensor 2664*b*. The first sensor 2664*a* may measure the temperature parameter at the central region of the substrate W. The second sensor 2664*b* may measure the temperature parameter at the edge region of the substrate W. As an example, the region-specific temperature parameter of the substrate W may be the power. Optionally, the temperature parameter may be resistance or a heating value.

The detector 2665 determines a warpage state of the substrate W based on temperature parameter values measured from the first sensor 2664*a* and the second sensor 2664*b*. The detector 2665 determines the warpage state of the substrate W by comparing the temperature parameter value measured by the first sensor 2664*a* and the temperature parameter value measured by the second sensor 2664*b*. For example, the detector 2665 determines that the substrate W is in a flat state when a difference between the temperature parameter values measured by the first sensor 2664*a* and the second sensor 2664*b* is within a set range. For example, the detector 2665 determines that the substrate W is in a curved state when the difference between the temperature parameter values measured by the first sensor 2664*a* and the second sensor 2664*b* is out of the set range. Optionally, a warpage degree of the substrate W may be divided into a plurality of warpage degrees and determined according to a degree of the difference in temperature parameter.

Hereinafter, a case where the region-specific temperature parameter of the substrate W is the power will be described as an example. The first sensor 2664*a* is connected to a first power supply line 2663*a*. The first sensor 2664*a* may measure the power supplied to the first heater 2662*a* from the first power supply line 2663*a*. The second sensor 2664*b* may measure the power supplied to the second heater 2662*b* from the second power supply line 2663*b*. The detector 2665 receives a power value measured from each of the first sensor 264*a* and the second sensor 2664*b*. The detector 2665 compares the power value for the central region of the substrate W measured by the first sensor 2664*a* and the power value for the edge region of the substrate W measured by the second sensor 2664*b*. The detector 2665 determines that the substrate W is in the warpage state when the power values received from the first sensor 2664*a* and the second sensor 2664*b* are different. As an example, a flat part of the substrate W has a large surface contact with the heating plate 2661. Heat transmission between the flat part of the substrate W and the heater 2662*a* provided in the heating plate 2661 is smooth. As a result, the heater 2662 provided at a location corresponding to the flat part of the substrate W has a large power amount applied from the power supply line 2663. Accordingly, the detector 2665 determines that the substrate W is in a convex state in a lower direction when the power values received from the first sensor 2664*a* is measured to be larger than the power value received from the second sensor 2664*b*.

In the exemplary embodiment, it is described that the sensor 2664 measures the region-specific temperature parameter of the substrate W placed on the heating plate 2661. However, the present invention is not limited thereto and the sensor 2664 may be provided as a distance sensor. As an example, the sensor 2664 may be provided as an infrared measurement sensor. The sensor 2664 may be provided on a ceiling surface of the housing 2620. A plurality of sensors 2664 may be provided to correspond to regions of the substrate W. Respective sensors 2664 may measure distances up to the substrate W from installation locations of the sensors 2664. The detector 2665 may determine the warpage state of the substrate W based on distance data measured by the respective sensors 2664. As an example, the detector 2665 may determine that the substrate W is in a state of being curved to be convex in the lower direction when a distance value detected by one sensor 2664 positioned at the edge region of the substrate W is smaller than a detected distance value of another sensor 2664 positioned at the central region of the substrate W.

Lift pins 2669 are provided on the heating plate 2661, which are drivable in the up and down direction in the third direction 6. The lift pin 2669 carries in the substrate W from a transportation means outside the heating unit 2660 and lays down the substrate W onto the heating plate 2661 or lifts the substrate W from the heating plate 2661 and takes over the substrate W to the transportation means outside the heating unit 2660. According to an example, three lift pins 2669 may be provided. The cover 2666 has a space of which lower portion is opened therein. The cover 2666 is positioned at an upper portion of the heating plate 2661 and moved in the up and down direction by the driver 2667. A space formed by the cover 2666 and the heating plate 2661 by moving the cover 2666 is provided as a heating space heating the substrate W. The heating unit 2660 provided in some heat treating chambers 260 among the heat treating chambers 260 may enhance an attachment rate of a photoresist to the substrate W by supplying gas while heating the substrate W. According to an example, the gas may be hexamethyldisilane.

The transfer plate 2680 is provided in a substantially disk shape, and has a diameter corresponding to the substrate W. A notch 2682 is formed at an edge of the transfer plate 2680. The notch 2682 is provided as a number corresponding to the support protrusion 2244 formed in the transfer hand 2240 of the transfer robot 224 and formed at a location corresponding to the support protrusion 2244. When upper and lower locations of the transfer hand 2240 and the transfer plate 2680 are changed at locations at which the transfer hand 2240 and the transfer plate 2680 are aligned in the up and down direction, the substrate W is transferred between the transfer hand 2240 and the transfer plate 2680. The transfer plate 2680 may be mounted on a guide rail 2692 and moved between a first region 2696 and a second region 2698 along the guide rail 2692 by the driver 2694.

A plurality of slit-shaped guide grooves 2684 is provided in the transfer plate 2680. The guide groove 2684 extends from an end of the transfer plate 2680 to an inside of the transfer plate 2680. A longitudinal direction of the guide groove 2684 is provided along the second direction 4, and the guide grooves 2684 are positioned spaced apart from each other in the first direction 2. The guide groove 2684 prevents the transfer plate 2680 and the lift pin 269 from interfering with each other when the substrate W is carried in and over between the transfer plate 2680 and the heating unit 2660.

The substrate W is cooled while the transfer plate 2680 on which the substrate W is placed is in contact with the cooling plate 2642. The transfer plate 2680 is provided as a material having a high thermal conductivity so as to excellently transmit the heat between the cooling plate 2642 and the substrate W. According to an example, the transfer plate 2680 may be provided as a metallic material.

Referring back to FIGS. 3 and 4, a plurality of liquid treating chambers 280 is provided. Some of the liquid treating chambers 280 may be provided to be laminated on each other. The liquid treating chambers 280 are arranged at one side of the transfer chamber 220. The heat treating chambers 280 are arranged in line in the first direction 2. Any some of the liquid treating chambers 280 are provided at locations adjacent to the index module 10. Hereinafter, the liquid treating chamber 280 is defined as a front liquid treating chamber 282. Other some of the liquid treating chambers 280 are provided at locations adjacent to the interface module 30. Hereinafter, the liquid treating chamber 280 is defined as a rear liquid treating chamber 284.

The front liquid treating chamber 282 coats the substrate W with a first liquid and the rear liquid treating chamber 284 coats the second substrate W with a second liquid. The first liquid and the second liquid may be different types of liquids. According to an exemplary embodiment, the first liquid is the anti-reflective film and the second liquid is the photoresist. The substrate W coated with the anti-reflective film may be coated with the photoresist. Optionally, the first liquid may be the photoresist and the second liquid the anti-reflective film. In this case, the substrate W coated with the photoresist may be coated with the anti-reflective film. Optionally, the first liquid and the second liquid may be the same type of liquids, and both the first liquid and the second liquid may be the photoresist.

Figure 9:
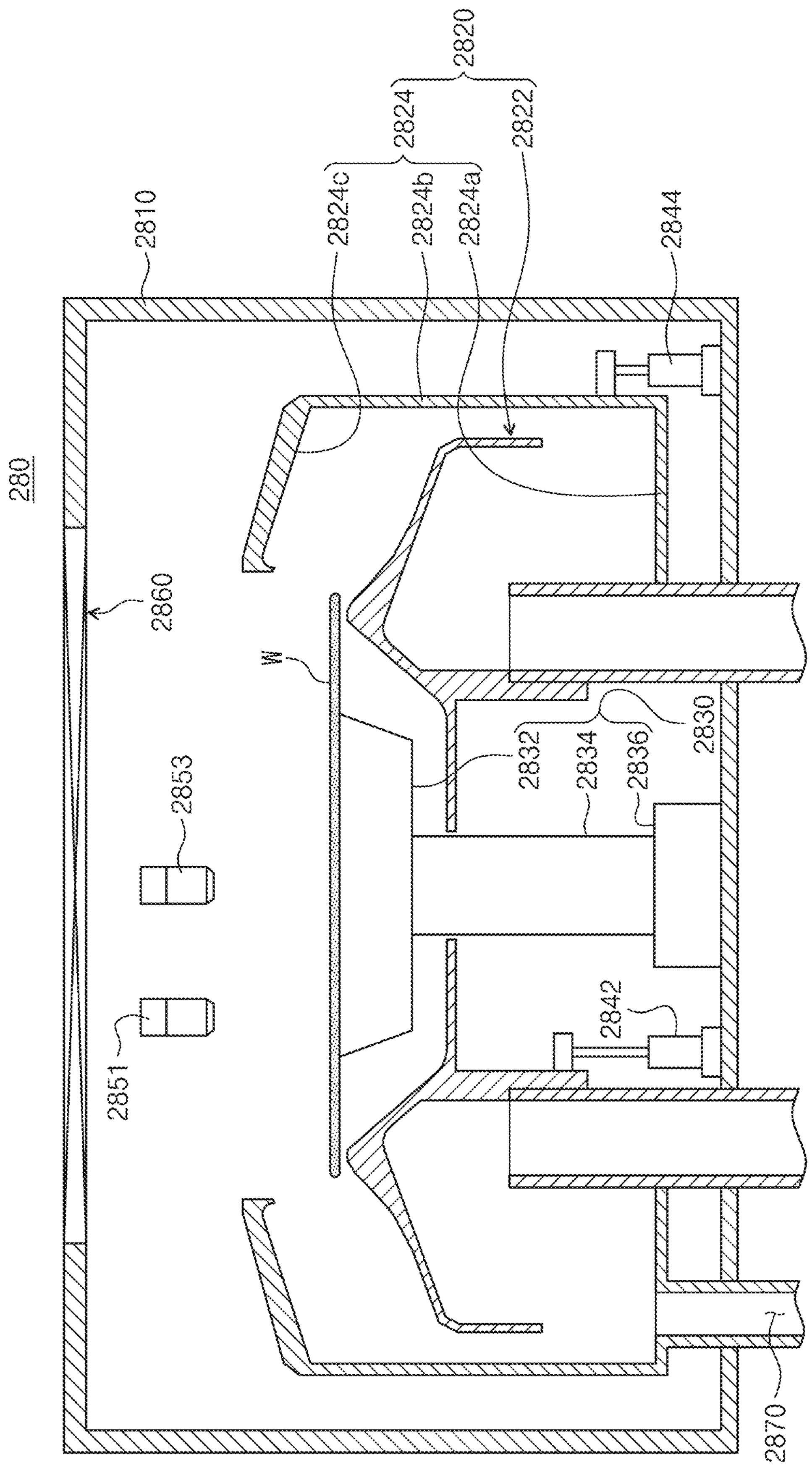
FIG. 9 is a diagram schematically illustrating an example of a liquid treating chamber in FIG. 4.

FIG. 9 is a diagram schematically illustrating an example of a liquid treating chamber in FIG. 4. Referring to FIG. 9, the liquid treating chamber 280 includes a housing 2810, a treating container 2820, a support unit 2830, an elevation unit 2840, and a liquid supply unit 2850.

The housing 2810 provides the space therein. The housing 2810 is provided in the substantially rectangular parallelepiped shape. An opening (not illustrated) may be formed at one side of the housing 2810. The opening serves as the entrance through which the substrate W is carried in the internal space or the substrate W is taken over from the internal space. Further, in order to selectively seal the entrance, a door (not illustrated) may be installed at a region adjacent to the entrance. The door may seal the internal space by blocking the entrance while a treating process for the substrate W carried in the internal space is performed. The treating container 2820, the support unit 2830, the elevation unit 2840, and the liquid supply unit 2850 are arranged in the housing 2810.

The treating container 2820 may have a treating space of which upper portion is opened. The treating container 2820 may have a bowl having the treating space. The internal space may be provided to surround the treating space. The treating container 2820 may have a cup shape of which upper portion is opened. The treating space of the treating container 2820 may be a space in which the support unit 2830 to be described below supports and rotates the substrate W. The treating space may be a space in which the liquid supply unit 2850 to be described below supplies a fluid to treat the substrate W.

According to an example, the treating container 2820 may include an inner cup 2822 and an outer cup 2824. The outer cap 2824 may be provided to surround a circumference of the support unit 2830 and the inner cup 2822 may be positioned inside the outer cap 2824. Each of the inner cup 2822 and the outer cap 2824 may have the annular ring shape when viewed from the top. A space between the inner cup 2822 and the outer cup 2824 may be provided as a recovery path in which the fluid introduced into the treating space is recovered.

The inner cup 2822 may be provided in a shape to surround a support axis 2834 of the support unit 2830 to be described below when viewed from the top. For example, the inner cup 2822 may be provided in a circular plate shape to surround the support axis 2834 when viewed from the top.

When viewed from the top, the inner cup 2822 may be positioned to overlap with an exhaust line 2860 to be described below, which is coupled to the housing 2810.

The inner cup 2822 may have an inner portion and an outer portion. Top surfaces of the inner portion and the outer portion, respectively may be provided to have different angles based on a virtual horizontal line. For example, the inner portion may be positioned to overlap with a body 2832 of the support unit 2830 to be described below when viewed from the top. The inner portion may be positioned to face the support axis 2834. As the inner portion is away from the support axis 2834, the top surface faces a direction inclined upward and the outer portion may extend in an outer direction from the inner portion. As the top surface is away from the support axis 2834, the outer portion may face a direction of being inclined downward. An upper end of the inner portion may coincide with a side end portion of the substrate W in the up and down direction. According to an example, a point where the outer portion and the inner portion meet may be a location lower than the upper end of the inner portion. The point where the inner portion and the outer portion meet may be provided to be rounded. The outer portion is combined with the outer cup 2824 to form a recovery path in which a treating medium is recovered.

The outer cup 2824 may be provided in the cup shape to cover the support unit 2830 and the inner cup 2822. The outer cup 2824 may include a bottom portion 2824*a*, a side portion 2824*b*, and an inclination portion 2824*c*.

The bottom portion 2824*a* may have the circular plate shape with a hollow. A recovery line 2870 may be connected to the bottom portion 2824*a*. The recovery line 2870 may recover the treating medium supplied onto the substrate W. The treating medium recovered by the recovery line 2870 may be reused by an external reproduction system (not illustrated).

The side portion 2824*b* may have the annular ring shape to cover the support unit 2830. The side portion 2824*b* may extend in a vertical direction from a side end of the bottom portion 2824*a*. The side portion 2824*b* may extend upward from the bottom portion 2824*a*.

The inclination portion 2824*c* may extend in a direction toward a central axis of the outer cup 2824 from the upper end of the side portion 2824*b*. An inner surface of the inclination portion 2824*c* may be provided to be inclined upward to be close to the support unit 2830. The inclination portion 2824*c* may be provided to have the ring shape. The upper end of the inclination portion 2824*c* may be positioned higher than the substrate W supported on the support unit 2830 while the treating process for the substrate W is being conducted.

The support unit 2830 supports the substrate W and rotates the substrate W in the treating space. The support unit 2830 may be a chuck which supports and rotates the substrate W. The support unit 2830 may include a body 2832, a support axis 2834, and a driving unit 2836. The body 2832 may have an upper surface on which the substrate W is seated. The upper surface of the body 2832 is provided in a substantially circular shape when viewed from the top. The upper surface of the body 2832 may be provided to have a smaller diameter than the substrate W. An adsorption hole (not illustrated) is formed in the body 2832 to fix the substrate W in a vacuum adsorption scheme.

The support axis 2834 is coupled to the body 2832. The support axis 2834 may be coupled to a bottom surface of the body 2832. The support axis 2834 may be provided so that the longitudinal direction faces the up and down direction. The support axis 2834 is provided to be rotatable by receiving power from the driving unit 2836. The support axis 2834 is rotated by rotating the driving unit 2836 to rotate the body 2832. The driving unit 2836 may vary a rotational speed of the support axis 2834. The driving unit 2836 may be a motor that provides driving force. However, the driving unit 2836 is not limited thereto, and may be variously modified to a known device which provides the driving force.

The elevation unit 2840 adjusts a relative height between the treating container 2820 and the support unit 2830. The elevation unit 2840 may include a first elevation unit 2842, a second elevation unit 2844, and a third elevation unit 2846. The first elevation unit 2842 may be coupled to the inner cup 2822 of the treating container 2820. The first elevation unit 2842 linearly moves the inner cup 2822 in the third direction 6. The second elevation unit 2842 may be coupled to the outer cup 2824 of the treating container 2820. The second elevation unit 2844 linearly moves the outer cup 2824 in the third direction 6. The third elevation unit 2846 may be coupled to the support unit 2830. The third elevation unit 2846 linearly moves the support unit 2830 in the third direction 6. Each of the first elevation unit 2842, the second elevation unit 2844, and the third elevation unit 2846 may be controlled by a controller 3000 to be described below.

The liquid supply unit 2850 may supply the liquid to the substrate W supported on the support unit 2830. The liquid supply unit 2850 may supply the liquid to the substrate W supported on the support unit 2830. The liquid which the liquid supply unit 2850 supplies to the substrate W may be a coating liquid. For example, the coating liquid may be a photosensitive liquid such as a photoresist (PR). Further, the liquid supply unit 2850 may supply a pre-wet liquid to the substrate W supported on the support unit 2830. The pre-wet liquid which the liquid supply unit 2850 supplies to the substrate W may be a liquid which may change a surface property of the substrate W. For example, the pre-wet liquid may be a liquid which may change the surface property of the substrate W to have a hydrophobic property. For example, the pre-wet liquid may be a thinner.

The liquid supply unit 2850 may include a pre-wet nozzle 2851, a liquid nozzle 2853, an arm 2855, a rail 2857, and a driver 2859. The pre-wet nozzle 2851 may supply the pre-wet liquid to the substrate W. The pre-wet nozzle 2851 may supply the pre-wet liquid to the substrate W by a stream scheme. The treating liquid nozzle 2853 may supply a treating liquid to the substrate W. The treating liquid nozzle 2853 may be a coating liquid nozzle that supplies the coating liquid such as the photoresist. The treating liquid nozzle 2853 may supply the treating liquid to the substrate W by the stream scheme.

The arm 2855 may support the pre-wet nozzle 2851 and the treating liquid nozzle 2853. The pre-wet nozzle 2851 and the treating liquid nozzle 2853 may be installed at one end of the arm 2855. Each of the pre-wet nozzle 2851 and the treating liquid nozzle 2853 may be installed on the bottom surface of one end of the arm 2855. When viewed from the top, the pre-wet nozzle 2851 and the treating liquid nozzle 2853 may be arranged in a direction parallel to the longitudinal direction of the rail 2857 to be described below. The other end of the arm 2855 may be coupled to the driver 2859.

The arm 2855 may be moved by the driver 2859. As a result, the locations of the pre-wet nozzle 2851 and the treating liquid nozzle 2853 installed in the arm 2855 may be changed. A movement direction of the arm 2855 may be guided along the rail 2857 in which the driver 2859 is installed. The rail 2857 may be provided so that the longitudinal direction faces a horizontal direction. For example, the rail 2857 may be provided so that the longitudinal direction faces a direction parallel to the first direction 2. Optionally, the arm 2855 may be coupled and rotated to a rotational axis of which longitudinal direction faces the third direction 6. The rotational axis may be rotated by the driver. Therefore, the locations of the pre-wet nozzle 2851 and the treating liquid nozzle 2853 installed in the arm 2855 may be changed.

The exhaust line 2860 may be provided outside the process chamber 280. A pressure reduction unit (not illustrated) is installed in the exhaust line 2860. The exhaust line 2860 exhausts an atmosphere inside the treating space by the pressure reduction unit. The exhaust line 2860 may be coupled to the treating container 2820. Optionally, the exhaust line 2860 may be coupled to the bottom portion 2824*a* of the outer cup 2824. When viewed from the top, the exhaust line 2860 may be positioned to overlap with the inner cup 2822.

An air flow supply unit 2880 supplies an air flow to the internal space of the housing 2810. The air flow supply unit 2880 may supply a descending air flow to the internal space. The air flow supply unit 2880 may supply an air flow of which temperature and/or humidity is controlled to the internal space. The air flow supply unit 2880 may be installed in the housing 2810. The air flow supply unit 2880 may be installed above the treating container 2820 and the support unit 2830. The air flow supply unit 2880 may include a fan 2882, an air flow supply line 2884, and a filter 2886. The air flow supply unit 2884 may supply an external air flow of which temperature and/or humidity is controlled to the internal space. The filter 2886 may be installed in the air flow supply line 2884. The filter 2886 may remove impurities included in the external air flow which flows on the air flow supply line 2884. When the fan 2882 is driven, the eternal air flow supplied by the air flow supply line 2884 may be uniformly delivered to the internal space.

The controller 3000 controls the first elevation unit 2842, the second elevation unit 2844, and the third elevation unit 2846 so as to control the relative height between the treating container 2820 and the support unit 2830. Hereinafter, a case where the controller 3000 elevates and moves the outer cup of the treating container 2820 by controlling the second elevation unit 2844 will be described as an example. The controller 3000 receives information on the warpage state of the substrate W from the detector 2665. When the substrate W is carried in the liquid treating chamber 280 after heat treatment for the substrate W is completed in the heat treating chamber 260, the controller 3000 may control the elevation movement of the treating container 2820 according to the warpage state of the substrate W determined by the heat treating chamber 260.

Figure 10:
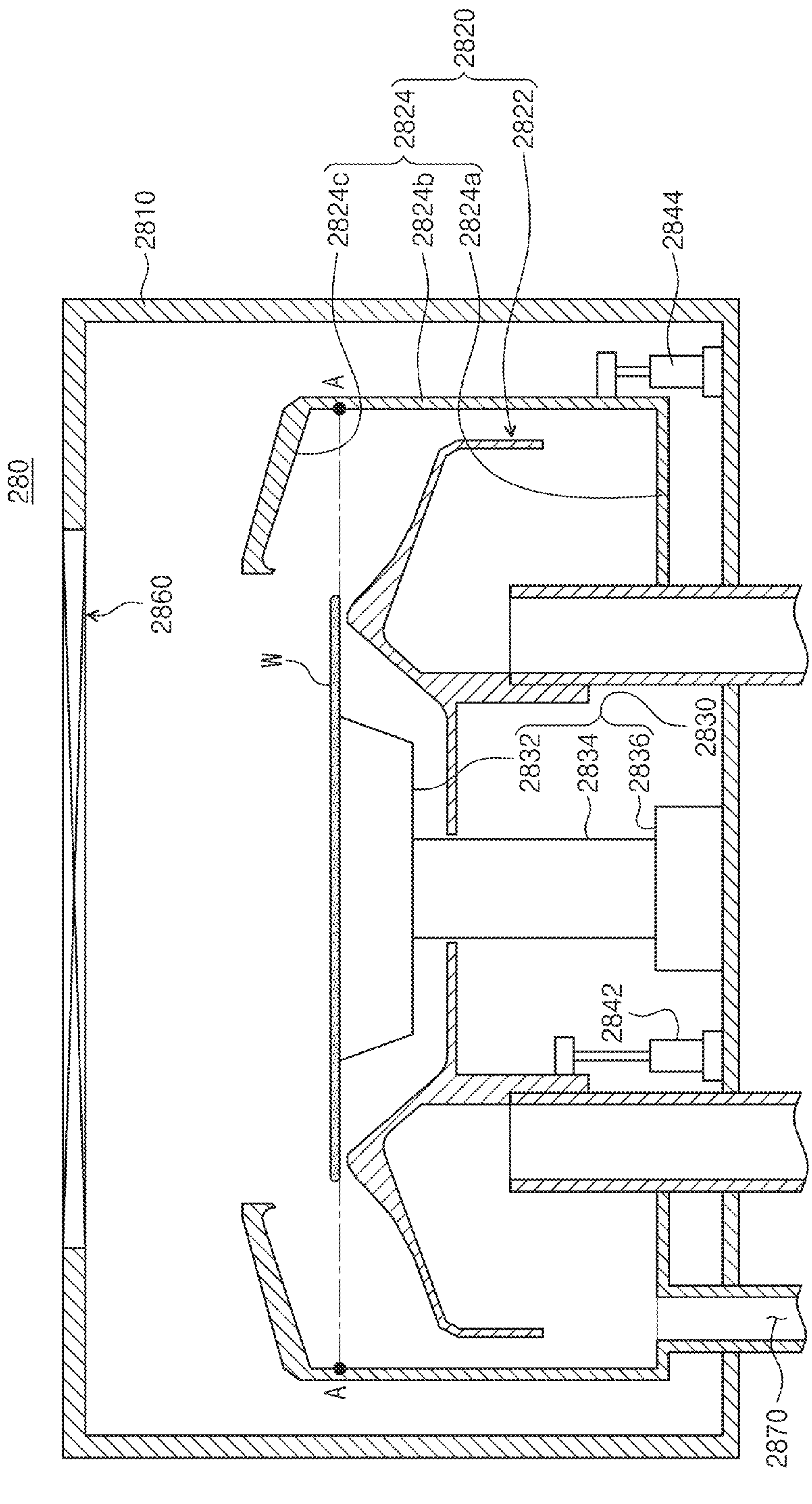
FIG. 10 is a diagram schematically illustrating the liquid treating chamber when a substrate is flat.
Figure 11:
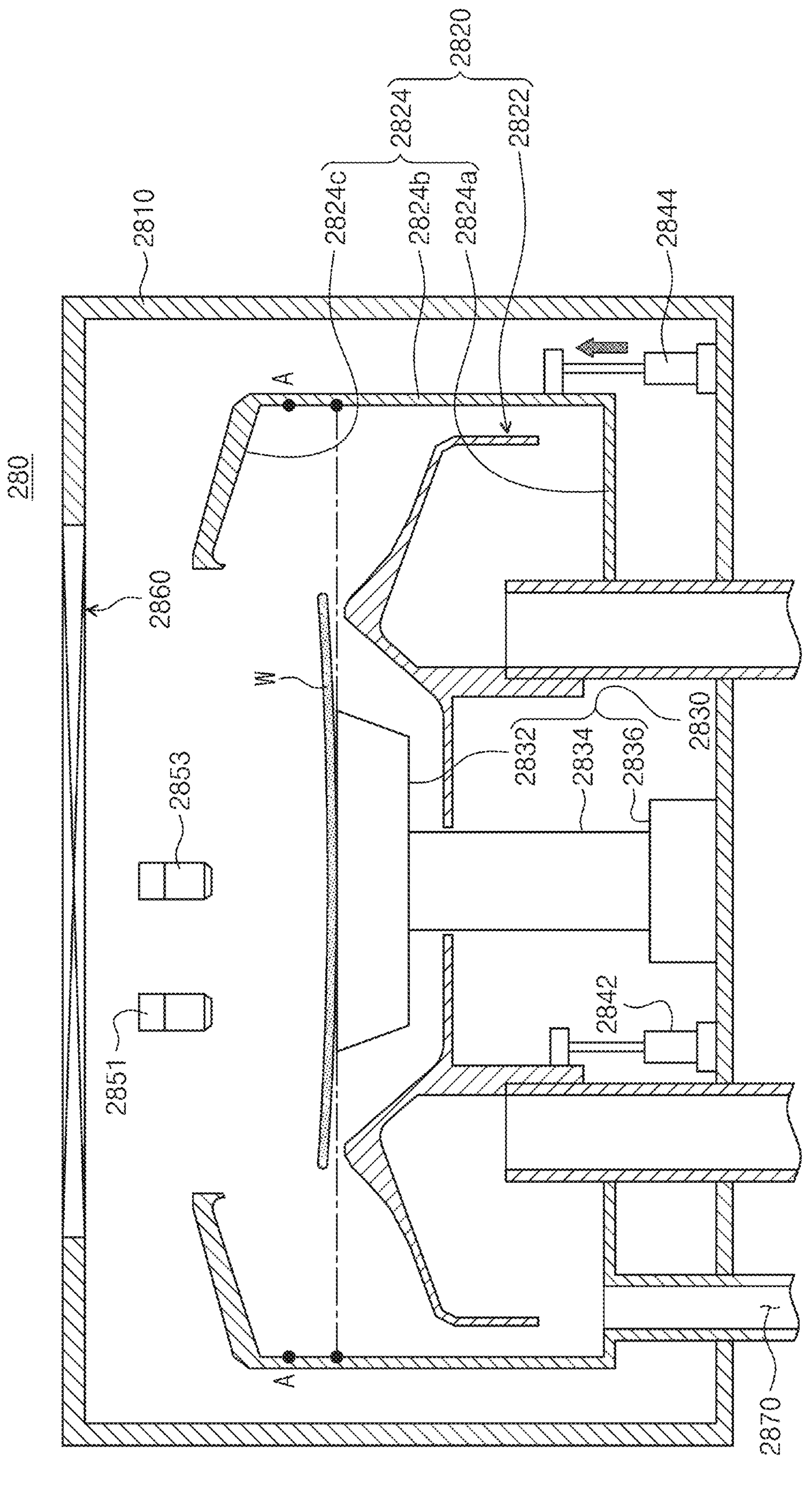
FIG. 11 is a diagram schematically illustrating the liquid treating chamber when the substrate is curved in a lower direction.

FIG. 10 is a diagram schematically illustrating the liquid treating chamber when a substrate is flat and FIG. 11 is a diagram schematically illustrating the liquid treating chamber when the substrate is curved in a lower direction. A point of the side portion 2824*b* of the treating container 2802 corresponding to a virtual line horizontally linked toward the side portion 2824*b* of the treating container 2820 from the top surface of the support unit 2830 is defined as a reference height A.

Referring to FIG. 10, the controller 3000 receives information indicating that the substrate W is in the flat state from the detector 2665. The controller 3000 controls the second elevation unit 2844 based on the information received from the detector 2665. The controller 3000 controls the second elevation unit 2844 so that the top surface of the support unit 2830 is arranged at a height corresponding to the reference height A of the treating container 2830. As an example, the controller 3000 may control the second elevation unit 2844 before the substrate W is carried in the liquid treating chamber 280 or before the substrate W is carried in the liquid treating chamber 280 and liquid treating starts.

Referring to FIG. 11, the controller 3000 receives information indicating that the substrate W is in the curved state in the lower direction from the detector 2665. The controller 3000 controls the second elevation unit 2844 based on the information received from the detector 2665. The controller 3000 moves the treating container 2830 in the upper direction by controlling the second elevation unit 2844 so that the top surface of the support unit 2830 is arranged below the reference height A of the treating container 2830. As an example, the controller 3000 may control the second elevation unit 2844 before the substrate W is carried in the liquid treating chamber 280 or before the substrate W is carried in the liquid treating chamber 280 and liquid treating starts.

Figure 12:
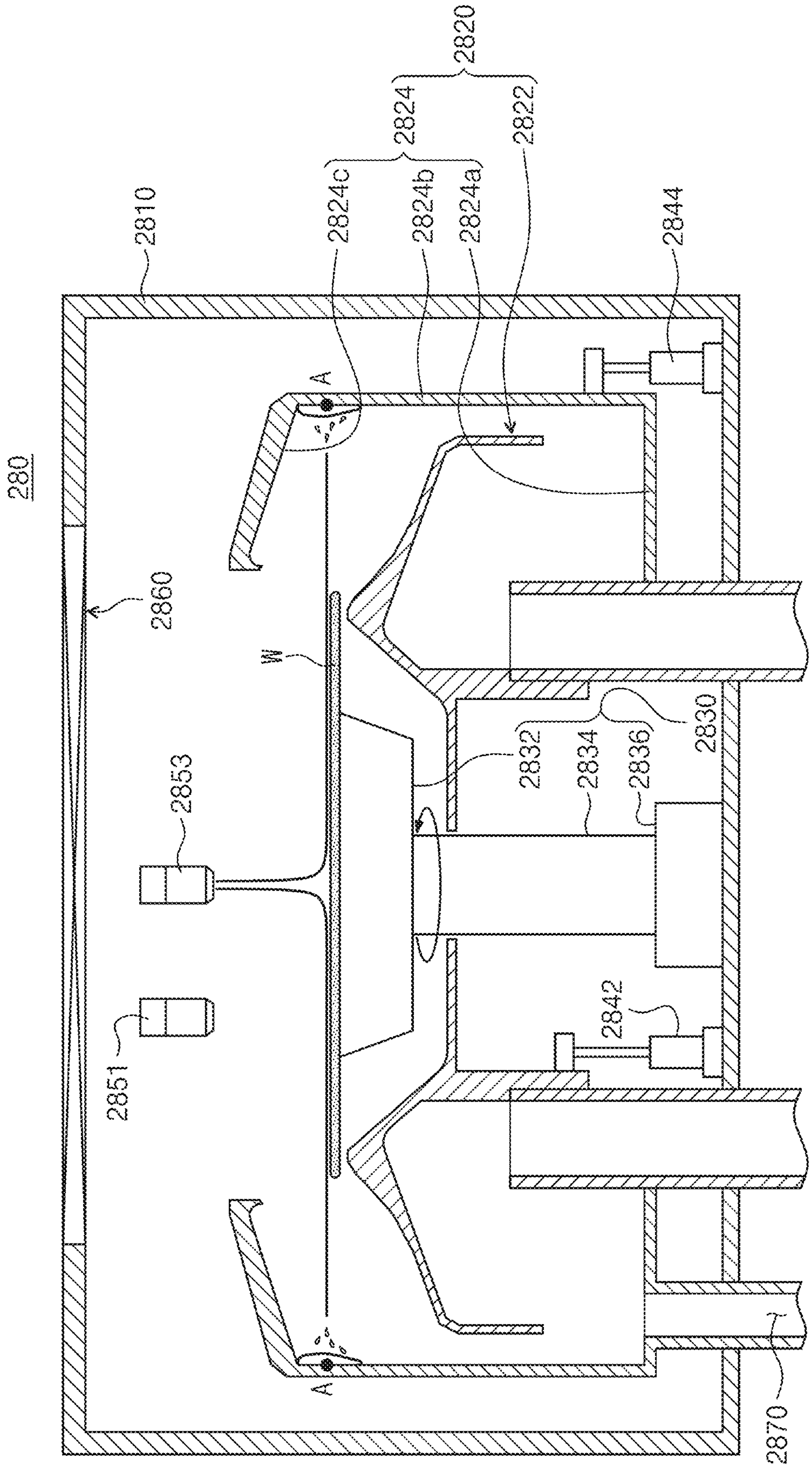
FIG. 12 is a diagram schematically illustrating an example of discharging a liquid onto the substrate in the liquid treating chamber in FIG. 10.
Figure 13:
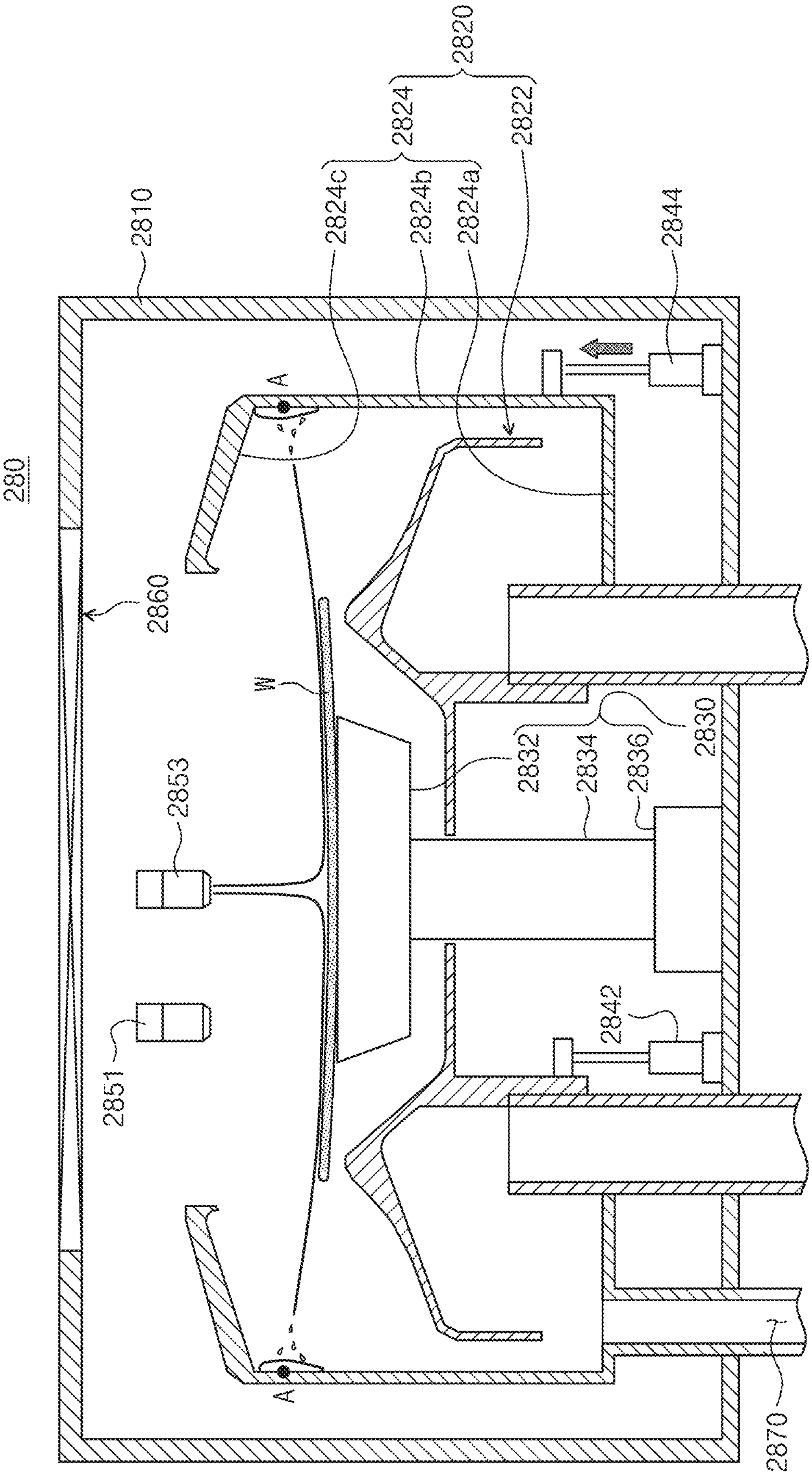
FIG. 13 is a diagram schematically illustrating an example of discharging the liquid onto the substrate in the liquid treating chamber in FIG. 11.

FIG. 12 is a diagram schematically illustrating an example of discharging a liquid onto the substrate in the liquid treatment chamber in FIG. 10. FIG. 13 is a diagram schematically illustrating an example of discharging the liquid onto the substrate in the liquid treatment chamber in FIG. 11.

Referring to FIGS. 12 and 13, a liquid discharged onto the rotating substrate W is scattered to the treating container 2820 in the liquid treating process. The scattered liquid attached to the treating container 2820. In a general substrate treating apparatus, if the liquid treating process is conducted for the substrate W which rotates in the warpage state without controlling the relative height of the treating container 2820 and the support unit 2830, the liquid may be scattered and deposited on the inclination portion 2824*c* of the treating container 2820. The liquid at the inclined portion 2824*c* of the treatment container 8200 is deposited, and as a result, the air flow speed may increase in the space formed between the treatment container 8200 and the support unit 8300. Various liquids including the coating liquid supplied to the substrate W may be lost due to the increased air flow speed. Further, the liquid supplied from the liquid supply unit 8400 is scattered in the treating space to contaminate the substrate W subjected to the liquid treating process. If the liquid is continuously deposited on the inclination portion 2824*c* of the treating container 2820, the loss of various treating liquids and the contamination problem of the subsequent substrate W are intensified when the liquid treating process is conducted for the subsequent substrate W.

The controller 3000 according to the exemplary embodiment of the present invention may induce the liquid discharged onto the substrate W to be scattered to point A of the side portion 2824*b* of the treating container 2830 by controlling the second elevation unit 2844 so as to control the relative height of the treating container 2820 and the support unit 2830 based on the warpage state information of the substrate W received from the detector 2665. Even when the substrate W is in the flat state, the liquid may be scattered to point A. Even when the substrate W is warped in the convex state in the lower direction, the liquid may be scattered to point A. As a result, since the liquid scattered in the liquid treating process may be spotted to a specific point of the treating container 2830, a coating failure may be minimized when conducting the liquid treating process for the subsequent substrate W.

In the exemplary embodiment, it is described that the controller 3000 controls the second elevation unit 2844 so as to elevate and move the treating container 2820. However, although is not limited thereto, the controller 3000 may elevate and move the support unit 2830 so as to control the relative height of the treating container 2820 and the support unit 2830 by controlling the second elevation unit 2844 so as to elevate and move the support unit 2830 according to the warpage state of the substrate W.

Optionally, the controller 3000 may control the relative height of the treating container 2820 and the support unit 2830 by controlling each of the second elevation unit 2844 and the third elevation unit 2846 so as to elevate and move each of the treating container 2820 and the support unit 2830 according to the warpage state of the substrate. As an example, when the controller 3000 receives the information indicating that the substrate W is in the curved state in the lower direction from the detector 2665, the controller 3000 may move the treating container 2830 in the upper direction by controlling the second elevation unit 2844 and move the support unit 2830 in the lower direction by controlling the third elevation unit 2846 so that the top surface of the support unit 2830 is arranged below the reference height A of the treating container 2830.

Figure 14:
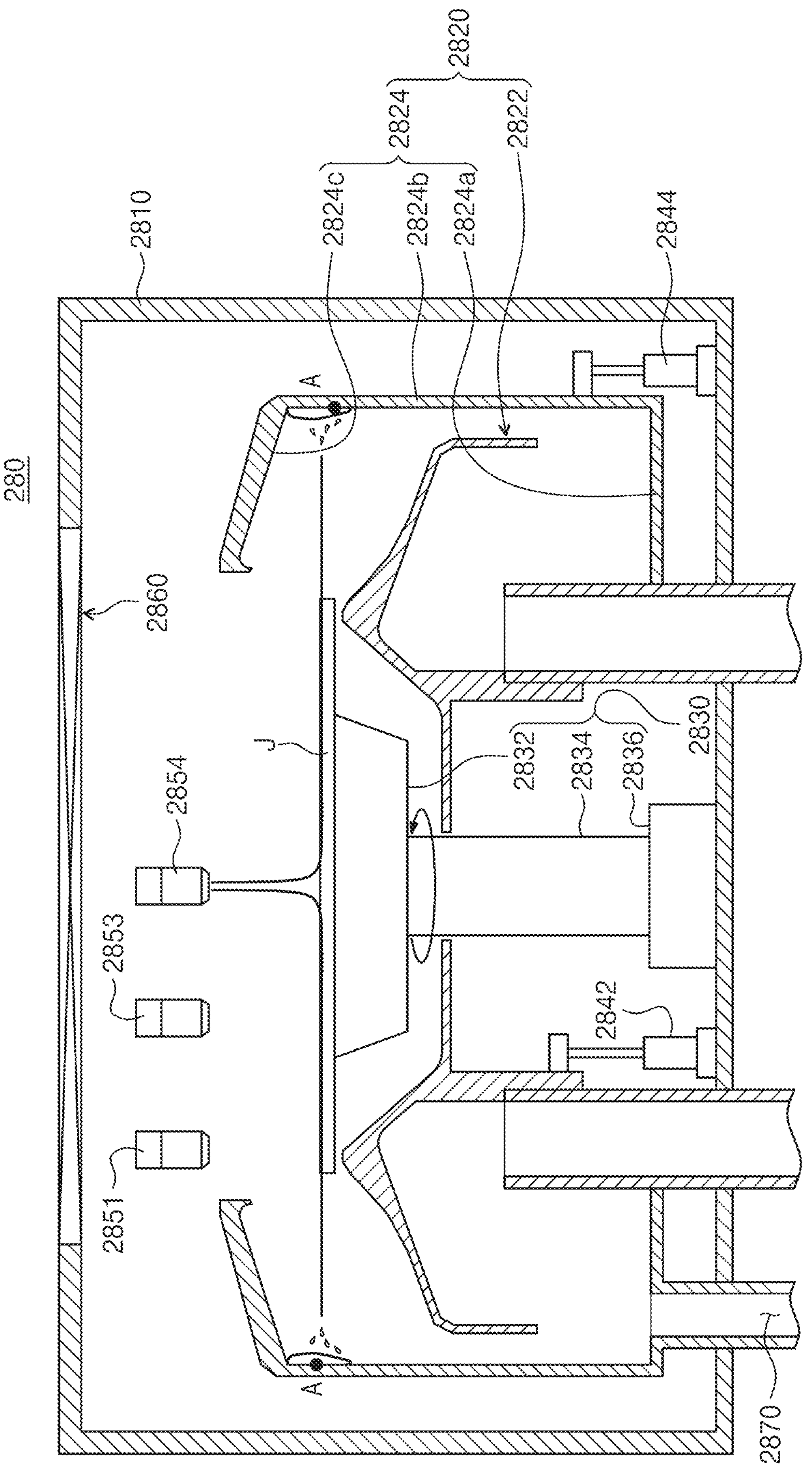
FIGS. 14 and 15 are views schematically illustrating another example of the liquid treating chamber in FIG. 9.
Figure 15:
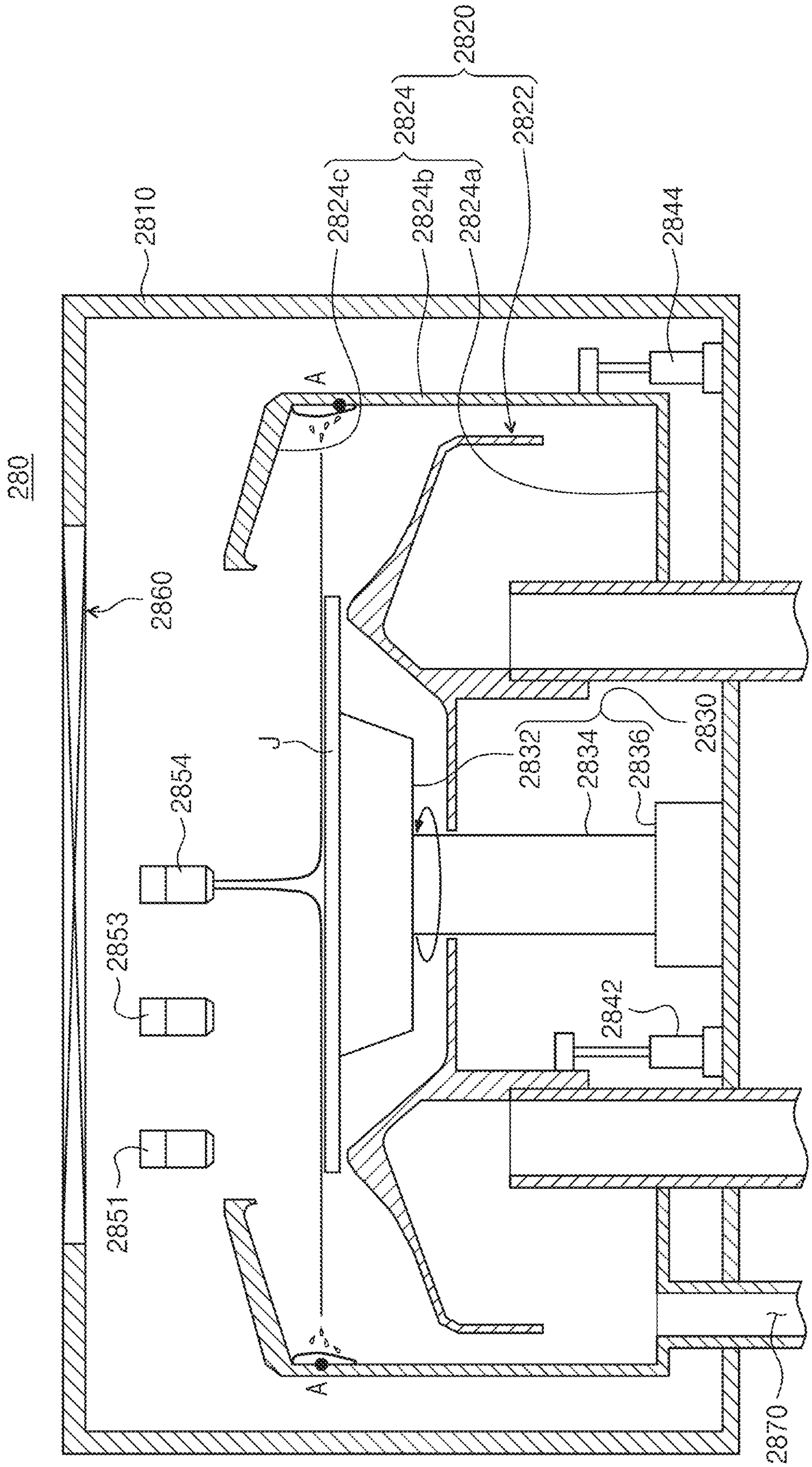

FIGS. 14 and 15 are views schematically illustrating another exemplary of the liquid treating chamber in FIG. 9. Since the exemplary embodiment described in FIGS. 14 and 15 is provided similarly to the housing 2810, the treating container 2820, the support unit 2830, the elevation unit 2840, and the exhaust unit 2890 described in the exemplary embodiment of FIGS. 9 to 13, a description thereof is omitted.

The liquid supply unit 2850 may include the pre-wet nozzle 2851, the liquid nozzle 2853, a cleaning solution nozzle 2854, the arm 2855, the rail 2857, and the driver 2859. The pre-wet nozzle 2851 may supply the pre-wet liquid to the substrate W. The pre-wet nozzle 2851 may supply the pre-wet liquid to the substrate W by the stream scheme. The treating liquid nozzle 2853 may supply the treating liquid to the substrate W. The treating liquid nozzle 2853 may be the coating liquid nozzle that supplies the coating liquid such as the photoresist. The treating liquid nozzle 2853 may supply the treating liquid to the substrate W by the stream scheme. The cleaning solution nozzle 2854 may supply the cleaning solution to a jig plate J. The cleaning solution may clean is supplied to the jig plate J which rotates to clean the treating container 2820 by a centrifugal force. The cleaning solution may be pure water. The cleaning solution nozzle 2854 may supply the cleaning solution to the jig plate J by the stream scheme.

The arm 2855 may support the pre-wet nozzle 2851, the treating liquid nozzle 2853, and the cleaning solution nozzle 2854. The pre-wet nozzle 2851, the treating liquid nozzle 2853, and the cleaning solution nozzle 2854 may be installed at one end of the arm 2855. Each of the pre-wet nozzle 2851, the treating liquid nozzle 2853, and the cleaning solution nozzle 2854 may be installed on the bottom surface of one end of the arm 2855. When viewed from the top, the pre-wet nozzle 2851, the treating liquid nozzle 2853, and the cleaning solution nozzle 2854 may be arranged in the direction parallel to the longitudinal direction of the rail 2857 to be described below. The other end of the arm 2855 may be coupled to the driver 2859.

The arm 2855 may be moved by the driver 2859. As a result, the locations of the pre-wet nozzle 2851, the treating liquid nozzle 2853, and the cleaning solution nozzle 2854 installed in the arm 2855 may be changed. The movement direction of the arm 2855 may be guided along the rail 2857 in which the driver 2859 is installed. The rail 2857 may be provided so that the longitudinal direction faces the horizontal direction. For example, the rail 2857 may be provided so that the longitudinal direction faces the direction parallel to the first direction 2. Optionally, the arm 2855 may be coupled and rotated to the rotational axis of which longitudinal direction faces the third direction 6. The rotational axis may be rotated by the driver. Therefore, the locations of the pre-wet nozzle 2851, the treating liquid nozzle 2853, and the cleaning solution nozzle 2854 installed in the arm 2855 may be changed.

Referring to FIG. 14, the controller 3000 receives information indicating that the substrate W is in the flat state from the detector 2665. The controller 3000 controls the second elevation unit 2844 based on the information received from the detector 2665. The controller 3000 controls the second elevation unit 2844 so that the top surface of the support unit 2830 is arranged at a height corresponding to the reference height A of the treating container 2830. As an example, the controller 3000 may control the second elevation unit 2844 before the substrate W is carried in the liquid treating chamber 280 or before the substrate W is carried in the liquid treating chamber 280 and liquid treating starts.

The pre-wet liquid or/and the coating liquid is supplied onto the substrate W seated on the support unit 2830. In this process, the pre-wet liquid or/and the coating liquid scattered on the substrate W is spotted onto point A of the side portion **2824*b* of the treating container 2820. After the pre-wet liquid or/and the coating liquid is supplied onto the substrate W, the substrate W is moved in the upper direction from the support unit 2830 and carried out to the outside of the liquid treating chamber 280. The jig plate J is seated on the support unit 2830. The cleaning solution nozzle 2854 may supply the cleaning solution onto the jig plate J. The cleaning solution scattered on the jig plate J is spotted onto point A of the side portion 2824*b* of the treating container 2820**. The pre-wet liquid or/and the coating liquid attached onto point A is removed by the cleaning solution.

Referring to FIG. 15, the controller 3000 receives information indicating that the substrate W is in the curved state in the lower direction from the detector 2665. The controller 3000 controls the second elevation unit 2844 based on the information received from the detector 2665. The controller 3000 moves the treating container 2830 in the upper direction by controlling the second elevation unit 2844 so that the top surface of the support unit 2830 is arranged below the reference height A of the treating container 2830. As an example, the controller 3000 may control the second elevation unit 2844 before the substrate W is carried in the liquid treating chamber 280 or before the substrate W is carried in the liquid treating chamber 280 and liquid treating starts.

The pre-wet liquid or/and the coating liquid is supplied onto the substrate W seated on the support unit 2830. In this process, the pre-wet liquid or/and the coating liquid scattered on the substrate W is spotted onto point A of the side portion **2824*b* of the treating container 2820. After the pre-wet liquid or/and the coating liquid is supplied onto the substrate W, the substrate W is moved in the upper direction from the support unit 2830 and carried out to the outside of the liquid treating chamber 280. The jig plate J is seated on the support unit 2830. The cleaning solution nozzle 2854 may supply the cleaning solution onto the rotating jig plate J. The cleaning solution is spotted onto point A of the side portion 2824*b* of the treating container 2820** by the centrifugal force. The pre-wet liquid or/and the coating liquid attached onto point A is removed by the cleaning solution.

The liquid discharged onto the rotating substrate W is scattered to the treating container 2820 in the liquid treating process. The scattered liquid attached to the treating container 2820. In a general substrate treating apparatus, if the liquid treating process is conducted for the substrate W which rotates in the warpage state without controlling the relative height of the treating container 2820 and the support unit 2830, the liquid may be scattered and deposited on the inclination portion 2824*c* of the treating container 2820. After the liquid treatment on the substrate W is performed, cleaning treatment of the treatment container 8200 may be performed. In this case, the liquid is deposited on the inclination portion 2824*c* which is an unintentional region of the treatment container 8200, and as a result cleaning efficiency for the treatment container 8200 is lowered. The liquid at the inclined portion 2824*c* of the treatment container 8200 is not removed, and as a result, the airflow speed may increase in the space formed between the treatment container 8200 and the support unit 8300. Various liquids including an application liquid supplied to the support unit 8300 may be lost due to the increased air flow speed. Further, the liquid supplied from the liquid supply unit 8400 is scattered in a treating space to contaminate a subsequent substrate W subjected to a subsequent liquid treating process.

According to the exemplary embodiment of the present invention, the pre-wet liquid or/and the coating liquid may be induced to be scattered to a specific point of the treating container 2820 regardless of the warpage state of the substrate W. As a result, the contamination due to the liquid scattered to an unexpected portion such as the inclination portion 2824*c* of the treating container 2820 may be prevented. Further, the liquid is inducted to be spotted to the specific point to easily perform cleaning using the jig plate J. As a result, the contamination of the subsequent W for which the subsequent liquid treating process is conducted may be minimized. Further, the liquid is prevented from being spotted to a point where cleaning is difficult by using the jig plate J to increase the process efficiency by solving a facility stop problem for cleaning the treating container 2820.

In the exemplary embodiment, an example of cleaning the treating container 2820 by using the jig plate J and the cleaning solution nozzle 2854 is described. However, the present invention is not limited thereto, and the treating container 2820 may be cleaned by using a back nozzle. However, the present invention is not limited thereto, and cleaning treating for the treating container 2820 may be performed by directly supplying the cleaning solution directly on the top surface or the bottom surface of the rotating body 2832.

Figure 16:
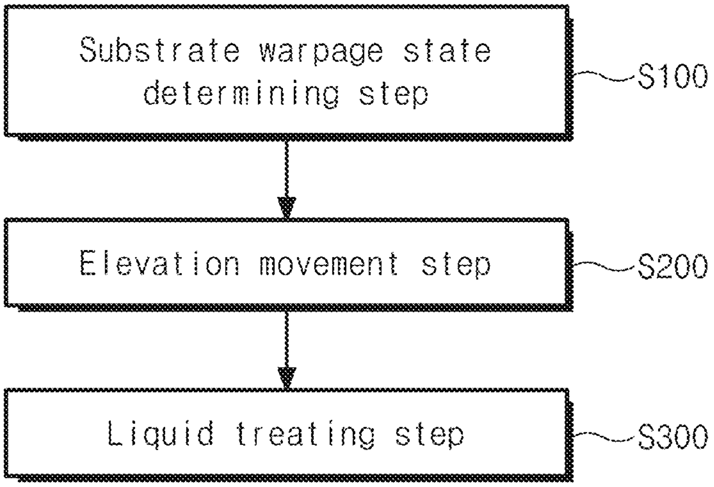
FIG. 16 is a flowchart showing a method for treating a substrate according to an exemplary embodiment of the present invention.

FIG. 16 is a flowchart showing a method for treating a substrate according to an exemplary embodiment of the present invention. Referring to FIG. 16, the method for treating a substrate according to an exemplary embodiment of the present invention may include a substrate warpage state determining step (S100), an elevation movement step (S200), and a liquid treating step (S300). In the method for treating a substrate according to an exemplary embodiment of the present invention, the substrate W is heat-treated in the heat treating chamber 260, and then the liquid treating may be sequentially conducted for the substrate W in the liquid treating chamber 280.

The substrate warpage state determining step (S100) may be performed by the heat treating chamber 260. The heat treating chamber 260 may heat the substrate W. The central region of the substrate W may be heated by the first heater 2662*a* of the heating plate 2661 provided to the heat treating chamber 260. The edge region of the substrate W may be heated by the second heater 2662*b* of the heating plate 2661 provided to the heat treating chamber 260. First power is supplied to the first heater 2662*a*. Second power is supplied to the second heater 2662*b*. The sensor 2664 measures each of the first power and the second power. The sensor 2664 measures values of the first power and the second power immediately after the substrate W is seated on the heating plate 2661. The detector 2665 may determine that the substrate W is in the warped state when the value of the first power measured by the sensor 2664 is measured to be higher than the value of the second power.

In the elevation movement step (S200), the relative height between the treating container 2820 and the support unit 2830 is adjusted. The second elevation unit 2844 elevates and moves so that the relative height between the treating container 2820 and the support unit 2830 according to the warpage of the substrate W. The adjustment of the relative height between the treating container 2820 and the support unit 2830 may be performed before the substrate W is carried in the liquid treating chamber 280 or before the substrate W is carried in the liquid treating chamber 280 and liquid treating starts.

A point of the side portion 2824*b* of the treating container 2802 corresponding to a virtual line horizontally linked toward the side portion 2824*b* of the treating container 2820 from the top surface of the support unit 2830 is defined as a reference height A. When it is determined that the substrate W is in the flat state in the substrate warpage state determining step (S100), the second elevation unit 2844 elevates so that the top surface of the support unit 2830 is arranged at a height corresponding to the reference height A of the treating container 2830. When it is determined that the substrate W is in the warpage state in the substrate warpage state determining step (S100), the second elevation unit 2844 elevates so that the top surface of the support unit 2830 is arranged at the height corresponding to the reference height A of the treating container 2830.

In the liquid treating step (S300), the liquid is supplied onto the rotating substrate W. As an example, the liquid may be the coating liquid. Further, as another example, the liquid may be the pre-wet liquid. The liquid is supplied onto the rotating substrate W, and as a result, the liquid is scattered to the treating container 2820 by the centrifugal force. In the elevation step (S2000, the liquid may be inducted to be scattered and attached to point A by adjusting the relative height between the treating container 2820 and the support unit 2830 according to the warpage state of the substrate W. Even when the substrate W is in the flat state, the liquid may be scattered to point A. Even when the substrate W is warped in the convex state in the lower direction, the liquid may be scattered to point A. As a result, since the liquid scattered in the liquid treating process may be spotted to a specific point of the treating container 2830, a coating failure may be minimized when conducting the liquid treating process.

The method for treating a substrate according to an exemplary embodiment of the present invention may further include a cleaning treating step (S400). The cleaning treating step (S400) may be performed after the liquid treating step (S300). In the cleaning treating step (S400), the substrate W is removed from the support unit 2830, and then the jig plate J is seated on the support unit 2830 to discharge the cleaning solution onto the jig plate J. The cleaning solution may be deionized water (DIW). The cleaning solution discharged onto the jig plate J is scattered to the side surface of the treating container by the centrifugal force. Since the liquid is scatted and attached to point A regardless of the warpage state of the substrate W in the liquid supplying step (S300), the cleaning solution may be scattered toward point A in the cleaning treating step (S400). As a result, the pre-wet liquid or/and the coating liquid attached onto point A is removed by the cleaning solution.

In the liquid supplying step (S300), the scattered liquid is prevented from being scattered to an unexpected part of the treating container 2820 to minimize contamination. Further, the liquid is inducted to be spotted to the specific point to easily perform cleaning using the jig plate J. The liquid is prevented from being spotted to a point where cleaning is difficult by using the jig plate J to increase the process efficiency by solving a facility stop problem for cleaning the treating container 2820.

In the warpage state determining step (S100) of the exemplary embodiment, it is described that the sensor 2664 measures each region-specific power of the substrate W placed on the heating plate 2661. However, although is not limited thereto, the sensor 2664 may measure resistances of the first heater 2662*a* and the second heater 2662*b*. Further, the sensor 2664 may be provided as the distance sensor. As an example, the sensor 2664 may be provided as the infrared measurement sensor. The sensor 2664 may be provided on the ceiling surface of the housing 2620. A plurality of sensors 2664 may be provided to correspond to regions of the substrate W. Respective sensors 2664 may measure distances up to the substrate W from installation locations of the sensors 2664. The detector 2665 may determine the warpage state of the substrate W based on distance data measured by the respective sensors 2664. As an example, the detector 2665 may determine that the substrate W is in a state of being curved to be convex in the lower direction when a distance value detected by a second sensor (not illustrated) positioned at the edge region of the substrate W is smaller than a detected distance value of a first sensor (not illustrated) positioned at the central region of the substrate W.

In the cleaning treating step (S400) of the exemplary embodiment, it is described as an example that the cleaning treating is performed by using the jig plate J. However, the present invention is not limited thereto, and cleaning treating for the treating container 2820 may be performed by directly supplying the cleaning solution directly on the top surface or the bottom surface of the rotating body 2832.

Referring back to FIGS. 2 to 4, the developing block 20*b* includes a transfer chamber 220, a buffer chamber 230, a heat treating chamber 260, and a liquid treating chamber 280. The transfer chamber 220, the buffer chamber 230, the heat treating chamber 260, and the liquid treating chamber 280 of the developing block 20*b* are provided in a substantially similar structure and layout to the transfer chamber 220, the buffer chamber 230, the heat treating chamber 260, and the liquid treating chamber 280 of the coating block 20*a*, a description thereof is omitted. However, a developing process of equally supplying the developing solution to all of the liquid treating chambers 280 of the developing block 20*b* to develop the substrate W is performed.

The interface module 30 connects the treating module 20 and an external exposure apparatus 40. The interface module 30 includes an interface frame 320, an additional process chamber 340, an interface buffer 360, and a transfer member 380.

The interface frame 320 provides the internal space. A fan filter unit forming the descending air flow in the internal space may be provided at the upper end of the interface frame 320. The additional process chamber 340, the interface buffer 360, and the transfer member 380 are provided in the internal space of the interface frame 320.

The additional process chamber 340 may perform a predetermined additional process before the substrate W of which process is completed in the coating block 20*a* is carried in the exposure apparatus 40. Optionally, the additional process chamber 340 may perform a predetermined additional process before the substrate W of which process is completed in the exposure apparatus 40 is carried in the developing block 20*b*. According to an example, the additional process may be an edge exposure process of exposing the edge region of the substrate W, a top surface cleaning process of cleaning the top surface of the substrate W, or a bottom surface cleaning process of cleaning the bottom surface of the substrate W. A plurality of additional process chambers 340 may be provided and provided to be laminated on each other. All of the additional process chambers 340 may be provided to perform the same process. Optionally, some of the additional process chambers 340 may be provided to perform different processes.

The interface buffer 360 provides a space in which the substrate W transferred among the coating block 20*a*, the additional process chamber 340, the exposure apparatus 40, and the developing block 20*b* temporarily stays in the middle of the transfer. A plurality of interface buffers 360 may be provided and the plurality of interface buffers 360 may be provided to be laminated on each other. According to an example, the additional process chamber 340 may be arranged on one side surface based on an extension line of the longitudinal direction of the transfer chamber 220, and the interface buffer 360 may be arranged on the other side surface.

The transfer member 380 transfers the substrate W among the coating block 20*a*, the additional process chamber 340, the exposure apparatus 40, and the developing block 20*b*. The transfer member 380 may be provided as one or a plurality of robots. According to an example, the transfer member 380 includes a first robot 3820, a second robot 3840, and a third robot 3860. The first robot 3820 transfers the substrate W among the coating block 20*a*, the additional process chamber 340, and the interface buffer 360. The second robot 3840 transfers the substrate W between the interface buffer 360 and the exposure apparatus 40. The third robot 3860 transfers the substrate W between the interface buffer 360 and the developing block 20*b*.

Each of the first robot 3820, the second robot 3840, and the third robot 3860 includes a hand in which the substrate W is placed. The hand may be provided to be movable forward and backward, rotatable with the third direction 6 as the axis and movable in the third direction 6. All of the hands of the first robot 3820, the second robot 3840, and the third robot 3860 may be provided in the same or similar shape as the transfer hand 2240 of the transfer robot 224. Optionally, the hand of the robot which directly sends and receives the substrate W to and form the cooling plate 2642 of the heat treating chamber may be provided in the same or similar shape as the transfer hand 2240 of the transfer robot 224, and the hand of the remaining robot may be provided in a different shape therefrom.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
- a liquid treating chamber configured to liquid-treat the substrate; and
- a controller configured to control the liquid treating chamber,
- wherein the liquid treating chamber includes
  - a treating container defining a treating space therein, the treating container including an outer cup and an inner cup, the outer cup including a discharge point;
  - a supporter configured to support and rotate the substrate in the treating space;
  - a liquid supply configured to supply a liquid onto the substrate;
  - a first elevator configured to adjust a height of the outer cup; and
  - a second elevator configured to adjust a height of the supporter, and
- the controller is configured to control the first elevator and the second elevator so as to adjust the height of the outer cup and the supporter according to a warpage state of the substrate supported on the supporter when conducting substrate treating by supplying the liquid onto the substrate while rotating the substrate such that the liquid scattered by the substrate while rotating is directed towards the discharge point,
- wherein the outer cup and the inner cup are provided to surround a circumference of the supporter, and the inner cup is positioned inside the outer cup,
- wherein the discharge point is a point of impact of the liquid scattered from the substrate when the substrate, being flat, is treated.

2. The apparatus of claim 1, wherein the controller is configured to control the first elevator and the second elevator so that a top surface of the supporter is arranged below an upper end of the outer cup by a reference height when the substrate is in a flat state for a ground surface and the top surface of the supporter is arranged below the reference height at the upper end of the treating container when the substrate is in a convex state in a lower direction for the ground surface.

3. The apparatus of claim 2, further comprising:
- a heat treating chamber configured to heat-treat the substrate,
- wherein the warpage state of the substrate is measured in the heat treating chamber.

4. The apparatus of claim 3, wherein the heat treating chamber includes
- a heating plate on which the substrate is placed;
- a sensor configured to measure each region-specific temperature parameter of the substrate placed on the heating plate; and
- a detector configured to determine the warpage state of the substrate based on a temperature parameter value measured by the sensor.

5. The apparatus of claim 4, wherein the heat treating chamber includes
- a first heater configured to heat a central region of the heating plate;
- a second heater configured to heat an edge region of the heating plate;
- a first power supply line configured to apply power to the first heater; and
- a second power supply line configured to apply the power to the second heater, and
- the sensor includes
  - a first sensor configured to measure the power supplied to the first power supply line; and
  - a second sensor configured to measure the power supplied to the second power supply line.

6. The apparatus of claim 5, wherein the detector is configured to determine that the substrate is in the warpage state when a power value of the first power supply line measured by the first sensor is measured to be higher than a power value of the second power supply line measured by the second sensor.

7. The apparatus of claim 6, wherein the sensor is configured to measure the power immediately after the substrate is seated on the heating plate.

8. The apparatus of claim 7, wherein the liquid is a photoresist.

9. The apparatus of claim 2, wherein the liquid treating chamber further includes a cleaning nozzle configured to discharge a cleaning solution for cleaning the treating container, and
- the controller is configured to control the first elevator and the second elevator so that a location where the cleaning solution supplied to the substrate reaches the treating container by a centrifugal force when the substrate is in the flat state and a location where the cleaning solution supplied to the substrate reaches the treating container by the centrifugal force when the substrate is in the convex state in the lower direction for the ground surface are same as each other.

10. The apparatus of claim 1, wherein the controller is configured to control the first elevator to adjust a position of the outer cup to maintain the discharge point of the outer cup relative to a shape of the substrate.

11. The apparatus of claim 1, wherein
- the inner cup extending under the supporter and into a cavity defined by the outer cup, the outer cup being integral and including an inclination portion above the inner cup, a side portion of the outer cup extending in a vertical direction, and a bottom portion of the outer cup extending under the inner cup, and
- the bottom portion of the outer cup includes a recovery line configured to recover the liquid supplied to the liquid treating chamber.

12. The apparatus of claim 11, wherein the inner cup includes an outer portion vertically overlapping and extending towards an opening of the recovery line.

13. The apparatus of claim 11, wherein the first elevator includes an inner elevator connected to an inner vertical face of the inner cup and an outer elevator connected to the side portion of the outer cup.

14. An apparatus for treating a substrate, the apparatus comprising:
- an index module having a load port in which a container storing the substrate is placed; and
- a treating module to perform a process of treating the substrate,
- wherein the treating module includes
  - a buffer chamber configured to temporarily keep the substrate;
  - a transfer chamber configured to transfer the substrate between the buffer chamber and the treating module;

a heat treating chamber configured to heat or cool the substrate;

a liquid treating chamber configured to supply a coating liquid or a developing liquid to the substrate; and a controller configured to control the liquid treating chamber, the liquid treating chamber includes a treating container defining a treating space therein, the treating container including an outer cup and an inner cup, the outer cup including a discharge point;

a supporter configured to support and rotate the substrate in the treating space;

a liquid supply configured to supply a liquid onto the substrate;

a first elevator configured to adjust a height of the outer cup; and a second elevator configured to adjust a height of the supporter, the controller is configured to control the first elevator and the second elevator so as to adjust the height of the outer cup and the supporter according to a warpage state of the substrate supported on the supporter when conducting substrate treating by supplying the liquid onto the substrate while rotating the substrate such that the liquid scattered by the substrate while rotating is directed towards the discharge point, and wherein the outer cup and the inner cup are provided to surround a circumference of the supporter, and the inner cup is positioned inside the outer cup, wherein the discharge point is a point of impact of the liquid scattered from the substrate when the substrate, being flat, is treated.

15. The apparatus of claim 14, wherein the controller is configured to control the first elevator and the second elevator so that a top surface of the supporter is arranged below an upper end of the treating container by a reference height when the substrate is in a flat state for a ground surface and the top surface of the supporter is arranged below the reference height at the upper end of the treating container when the substrate is in a convex state in a lower direction for the ground surface.

16. The apparatus of claim 15, wherein the heat treating chamber includes a heating plate on which the substrate is placed;

a first heater configured to heat a central region of the heating plate;

a second heater configured to heat an edge region of the heating plate;

a first power supply line configured to apply power to the first heater; and a second power supply line configured to apply the power to the second heater;

a sensor configured to measure each region-specific temperature parameter of the substrate placed on the heating plate; and a detector configured to determine the warpage state of the substrate based on a temperature parameter value measured by the sensor, the sensor includes a first sensor configured to measure the power supplied to the first power supply line; and a second sensor configured to measure the power supplied to the second power supply line, and the detector is configured to determine that the substrate is in the warpage state when a power value of the first power supply line measured by the first sensor is measured to be higher than a power value of the second power supply line measured by the second sensor.

17. The apparatus of claim 16, wherein the liquid treating chamber further includes a cleaning nozzle configured to discharge a cleaning solution for cleaning the treating container, and the controller is configured to control the first elevator and the second elevator so that a location where the cleaning solution supplied to the substrate reaches the treating container by a centrifugal force when the substrate is in the flat state and a location where the cleaning solution supplied to the substrate reaches the treating container by the centrifugal force when the substrate is in the convex state in the lower direction for the ground surface are same as each other.

18. The apparatus of claim 14, wherein the controller is configured to control the first elevator to adjust a position of the outer cup to maintain the discharge point of the outer cup relative to a shape of the substrate.

* * * * *